(12) United States Patent
Choi

(10) Patent No.: US 10,755,795 B2
(45) Date of Patent: Aug. 25, 2020

(54) STORAGE DEVICE INCLUDING NONVOLATILE MEMORY DEVICE, NONVOLATILE MEMORY DEVICE, OPERATING METHOD OF STORAGE DEVICE

(71) Applicant: SAMSUNG ELECTRONICS CO., LTD., Suwon-Si, Gyeonggi-Do (KR)

(72) Inventor: Shin-Ho Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

(21) Appl. No.: 16/107,976

(22) Filed: Aug. 21, 2018

(65) Prior Publication Data
US 2019/0206508 A1 Jul. 4, 2019

(30) Foreign Application Priority Data
Jan. 4, 2018 (KR) ......................... 10-2018-0001239

(51) Int. Cl.
*G11C 29/00* (2006.01)
*G11C 29/44* (2006.01)
(Continued)

(52) U.S. Cl.
CPC .......... *G11C 29/44* (2013.01); *G11C 11/5628* (2013.01); *G11C 11/5635* (2013.01); *G11C 11/5642* (2013.01); *G11C 16/08* (2013.01); *G11C 16/10* (2013.01); *G11C 16/14* (2013.01); *G11C 16/28* (2013.01); *G11C 16/3427* (2013.01); *G11C 29/021* (2013.01); *G11C 29/028* (2013.01); *G11C 29/04* (2013.01); *G11C 29/24* (2013.01); *G11C 29/50004* (2013.01); *G11C 11/5671* (2013.01); *G11C 16/0483* (2013.01); *G11C 29/38* (2013.01);
(Continued)

(58) Field of Classification Search
None
See application file for complete search history.

(56) References Cited

U.S. PATENT DOCUMENTS

| | | | |
|---|---|---|---|
| 7,995,393 B2 | 8/2011 | Kim et al. | |
| 8,902,657 B2 | 12/2014 | Iwai et al. | |
| 9,257,195 B2 | 2/2016 | Oh et al. | |
| 9,378,824 B2 | 6/2016 | Byun | |

(Continued)

FOREIGN PATENT DOCUMENTS

JP    5731622 B2    6/2015

OTHER PUBLICATIONS

Ashok K. Sharma, "Advanced Nonvolatile Memory Designs and Technologies," in Advanced Semiconductor Memories: Architectures, Designs, and Applications , IEEE, 2003, pp. 319-477 (Year: 2003).*

*Primary Examiner* — Daniel F. McMahon
(74) *Attorney, Agent, or Firm* — Volentine, Whitt & Francos, PLLC

(57) ABSTRACT

A storage device includes a controller and a nonvolatile memory device having memory cells and reference memory cells. The controller accesses first memory cells of the memory cells, reads first reference memory cells, which are associated with the first memory cells, from among the reference memory cells when the access to the first memory cells fails, determines a bad area depending on a read result of the first reference memory cells, and identifies second memory cells, which belong to the bad area, from among the memory cells to bad memory cells.

20 Claims, 26 Drawing Sheets

(51) Int. Cl.
*G11C 16/08* (2006.01)
*G11C 16/28* (2006.01)
*G11C 16/10* (2006.01)
*G11C 16/34* (2006.01)
*G11C 16/14* (2006.01)
*G11C 29/04* (2006.01)
*G11C 11/56* (2006.01)
*G11C 29/02* (2006.01)
*G11C 29/50* (2006.01)
*G11C 29/24* (2006.01)
*G11C 29/38* (2006.01)
*G11C 16/04* (2006.01)

(52) U.S. Cl.
CPC .............. *G11C 2029/0409* (2013.01); *G11C 2211/5621* (2013.01)

(56) References Cited

U.S. PATENT DOCUMENTS

| | | | |
|---|---|---|---|
| 2007/0168840 A1* | 7/2007 | Roohparvar | G06F 11/073 714/770 |
| 2012/0254680 A1* | 10/2012 | Oh | G06F 11/1068 714/723 |
| 2013/0173954 A1 | 7/2013 | Woo et al. | |
| 2015/0138885 A1 | 5/2015 | Iwai et al. | |
| 2015/0228352 A1* | 8/2015 | Choi | G11C 29/76 365/185.2 |
| 2015/0287479 A1 | 10/2015 | Nam et al. | |
| 2016/0019111 A1 | 1/2016 | Kochar et al. | |
| 2017/0075596 A1 | 3/2017 | Iwai et al. | |
| 2017/0090762 A1 | 3/2017 | Ea et al. | |
| 2017/0229184 A1 | 8/2017 | Yamauchi | |
| 2019/0196744 A1* | 6/2019 | Kim | G11C 5/143 |
| 2019/0206508 A1* | 7/2019 | Choi | G11C 16/08 |

* cited by examiner

STORAGE DEVICE INCLUDING NONVOLATILE MEMORY DEVICE, NONVOLATILE MEMORY DEVICE, OPERATING METHOD OF STORAGE DEVICE

CROSS-REFERENCE TO RELATED APPLICATIONS

This application claims priority under 35 U.S.C. § 119 to Korean Patent Application No. 10-2018-0001239 filed on Jan. 4, 2018, in the Korean Intellectual Property Office, the disclosure of which is incorporated by reference herein in its entirety.

BACKGROUND

Embodiments of the disclosure relate to a semiconductor memory, and more particularly, relate to a storage device including a nonvolatile memory device, the nonvolatile memory device, and an operating method of the storage device.

A nonvolatile memory device includes memory cells that retain data stored therein even at power-off. The nonvolatile memory device may include a flash memory device, a phase change memory device, a ferroelectric memory device, a magnetic memory device, a resistive memory device, etc.

If a defect occurs in memory cells or in surrounding materials of the memory cells, an access to the memory cells may fail. If the access to the memory cells fails, a storage space including the memory cells where the access fails may be set to a bad area. An access to the storage space that is set to the bad area is inhibited, thereby causing a decrease in a storage capacity of a nonvolatile memory device or the storage device.

SUMMARY

Embodiments of the disclosure provide a storage device including a nonvolatile memory device that reduces a decrease in a storage capacity due to setting a bad area, the nonvolatile memory device, and an operating method of the storage device.

According to an exemplary embodiment, a storage device includes a nonvolatile memory device that includes memory cells and reference memory cells, and a controller that accesses first memory cells of the memory cells, reads first reference memory cells, which are associated with the first memory cells, from among the reference memory cells when the access to the first memory cells fails, determines a bad area depending on a read result of the first reference memory cells, and sets second memory cells, which belong to the bad area, from among the memory cells to bad memory cells.

According to an exemplary embodiment, a nonvolatile memory device includes a memory cell array that includes memory cells and reference memory cells, a row decoder circuit that is connected to the memory cell array through word lines, a page buffer circuit that is connected to the memory cell array through bit lines, and a control logic circuit that controls the row decoder circuit and the page buffer circuit so as to access first memory cells of the memory cells and controls the row decoder circuit and the page buffer circuit so as to read first reference memory cells associated with the first memory cells when the access to the first memory cells fails. A bad area associated with the first memory cells is set depending on a read result of the first reference memory cells.

According to an exemplary embodiment, an operating method of a storage device which includes a nonvolatile memory device including memory cells and reference memory cells and a controller of the nonvolatile memory device includes accessing first memory cells of the memory cells, reading first reference memory cells, which are associated with the first memory cells, from among the reference memory cells when the access to the first memory cells fails, and determining a bad area associated with the first memory cells depending on a read result of the first reference memory cells.

According to an exemplary embodiment, a storage device includes a nonvolatile memory block and a controller. The nonvolatile memory block has planes, each of the planes includes strings and is addressed by a different string selection line, each of the strings within a same plane is addressed by a different bit line and includes user memory cells and reference memory cells, each of the user memory cells within a same string is addressed by a same bit line and a different word line, and each of the reference memory cells within a same string is addressed by a same bit line and a different word line or different selection line, which may be a string selection line. The controller: (1) accesses a first user memory cell among the user memory cells within the nonvolatile memory block, (2) reads, in response to determining an access fault with respect to accessing the first user memory cell, a first reference memory cell, among the reference memory cells within the nonvolatile memory block, that is associated with the first user memory cell, and (3) determines whether the first user memory cell is available for reuse in storing data based upon a first read result of reading the first reference memory cell.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
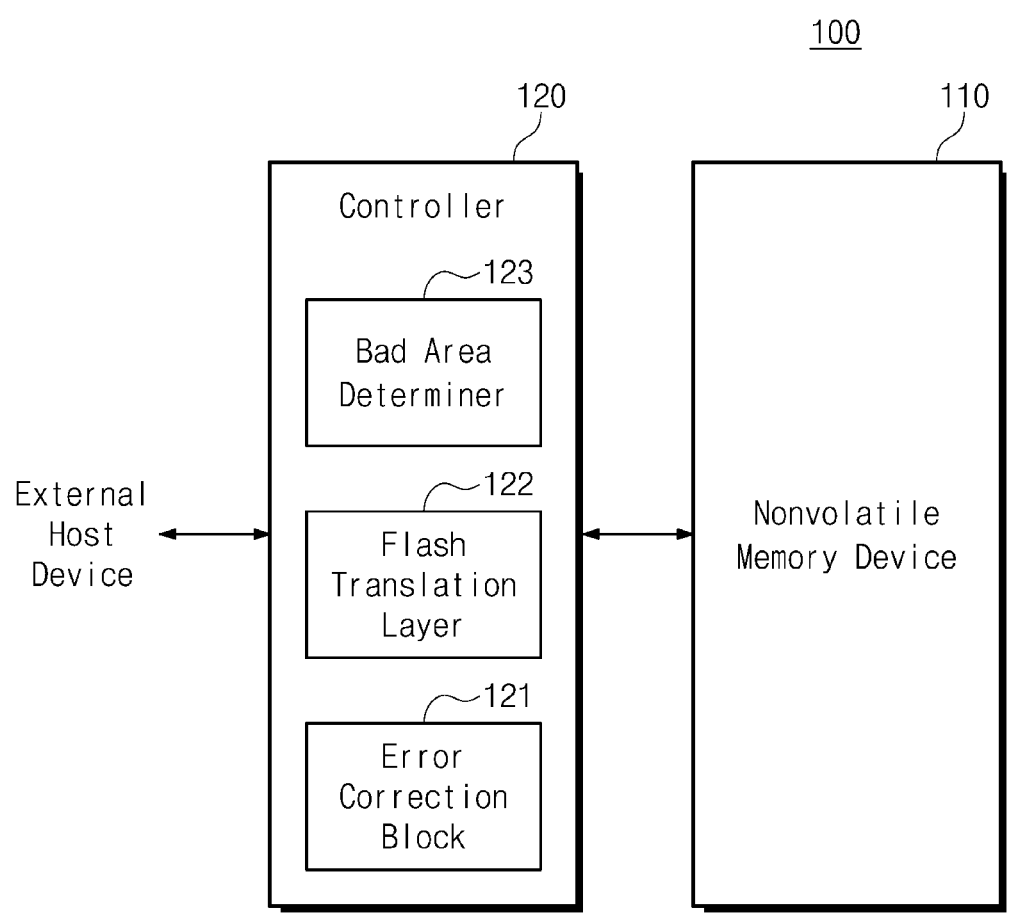
FIG. 1 is a block diagram illustrating a storage device according to an embodiment of the disclosure.

FIG. 1 is a block diagram illustrating a storage device 100 according to an embodiment of the disclosure. Referring to FIG. 1, the storage device 100 includes a nonvolatile memory device 110 and a controller 120.

The nonvolatile memory device 110 may perform write, read, and erase operations under control of the controller 120. The nonvolatile memory device 110 may receive a command and an address from the controller 120 through a first channel (e.g., an input/output channel). The nonvolatile memory device 110 may exchange data with the controller 120 through the first channel.

The nonvolatile memory device 110 may receive a control signal from the controller 120 through a second channel (e.g., a control signal channel). For example, the nonvolatile memory device 110 may communicate timing signals, which indicate timing when a command, an address, or data are transmitted, with the controller 120.

The nonvolatile memory device 110 may include two or more nonvolatile memory chips. The nonvolatile memory device 110 may receive a chip select signal, which indicates an access target of the two or more nonvolatile memory chips, from the controller 120 through the second channel.

The nonvolatile memory device 110 may output a signal indicating a busy state or a ready state to the controller 120 through the second channel.

The controller 120 is configured to drive firmware that manages the storage device 100 or the nonvolatile memory device 110. The controller 120 is configured to control the nonvolatile memory device 110. For example, the controller 120 may control the nonvolatile memory device 110 through the first channel and the second channel such that the nonvolatile memory device 110 performs a write, read or erase operation.

The controller 120 may control the nonvolatile memory device 110 under control of an external host device (not illustrated). For example, the controller 120 may communicate with the external host device in compliance with a second format that is different from a first format for communication with the nonvolatile memory device 110. A unit of data that the controller 120 conveys to the nonvolatile memory device 110 may be different from a unit of data that the controller 120 conveys to the external host device.

The controller 120 includes an error correction block 121, a flash translation layer 122, and a bad area determiner 123. The error correction block 121 may perform error correction encoding on data that the controller 120 will write in the nonvolatile memory device 110. For example, the error correction block 121 may generate parity from data and may add the parity to the data.

The error correction block 121 may perform error correction decoding on data read from the nonvolatile memory device 110. For example, by using the parity included in the data, the error correction block 121 may detect an error present in the data and may correct the detected error.

The flash translation layer 122 may convert (or translate) a first interface manner in which the external host device accesses the storage device 100, to a second interface manner in which the controller 120 accesses the nonvolatile memory device 110. For example, the flash translation layer 122 may convert an address system of the external host device to an address system of the nonvolatile memory device 110.

The external host device may receive capacity information (e.g., capacity information of a user area) from the storage device 100 and may assign logical addresses to the storage device 100 based on the capacity information. The external host device may access the storage device 100 based on the logical addresses.

The nonvolatile memory device 110 is accessed based on physical addresses. The flash translation layer 122 may translate logical addresses of the external host device to physical addresses of the nonvolatile memory device 110. The flash translation layer 122 may convert an access unit (e.g., a data size) of the external host device to an access unit of the nonvolatile memory device 110.

The flash translation layer 122 manages a storage space of the nonvolatile memory device 110. For example, the flash translation layer 122 may manage a user area, which is used to store data depending on a request of the external host device, of the storage space of the nonvolatile memory device 110 or a reserved area, which is used to manage the user area or to perform a background operation.

The flash translation layer 122 may further manage a bad area of the storage space of the nonvolatile memory device 110. For example, the flash translation layer 122 may inhibit a write or read operation with respect to a storage space, which is determined as a bad area, of the storage space of the nonvolatile memory device 110.

The bad area determiner 123 may determine a bad area of the storage space of the nonvolatile memory device 110. For example, when an access fail occurs in the nonvolatile memory device 110, the bad area determiner 123 may determine a bad area related to the access fail.

For example, the bad area determiner 123 may determine a type of the access fail and may differently set a bad area depending on the type of the access fail. For example, the bad area determiner 123 may differently set a size of a bad area, a directivity of the bad area, etc.

In an embodiment, the error correction block 121, the flash translation layer 122, or the bad area determiner 123 may be implemented with hardware such as an electronic circuit, a semiconductor circuit, an integrated circuit, or an intellectual property (IP) block in the integrated circuit. For another example, the error correction block 121, the flash translation layer 122, or the bad area determiner 123 may be implemented by firmware or software that is executed in hardware.

Figure 2:
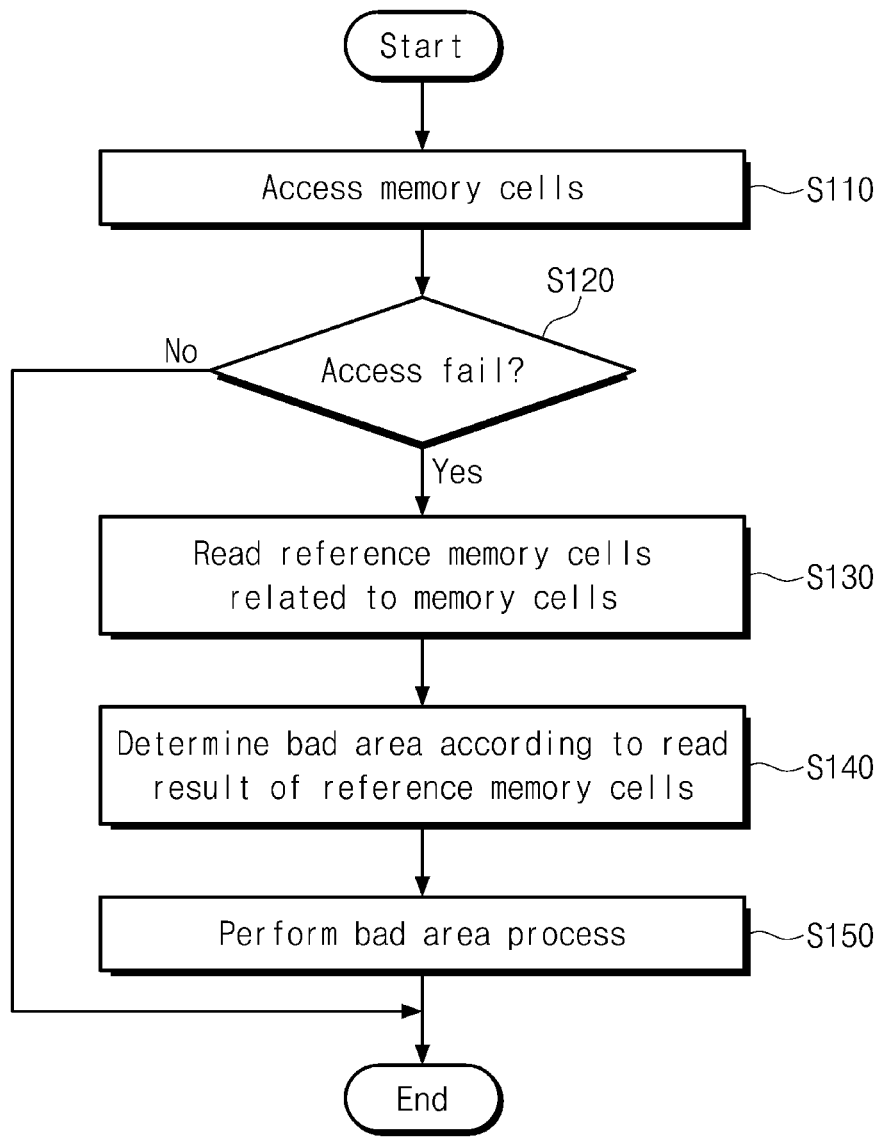
FIG. 2 is a flowchart illustrating an operating method of a storage device according to an embodiment of the disclosure.

FIG. 2 is a flowchart illustrating an operating method of the storage device 100 according to an embodiment of the disclosure. Referring to FIGS. 1 and 2, in operation S110, the controller 120 may access memory cells of the nonvolatile memory device 110. For example, the controller 120 may transmit an access command and an address to the nonvolatile memory device 110, and the nonvolatile memory device 110 may access memory cells in response to the access command.

In operation S120, if an access fail does not occur, the access may be successful. If the access fail occurs, operation S130 is performed. For example, the access fail may include a fail event that an access is not completed in the nonvolatile memory device 110 or a fail event that an access is completed in the nonvolatile memory device 110 but it is determined by the controller 120 that the access fails.

For example, in the case of a write operation, if a write operation is completed in the nonvolatile memory device 110, the controller 120 may determine that the write operation is successful. If a write operation of memory cells fails in the nonvolatile memory device 110 without completion, the nonvolatile memory device 110 may transmit a notification indicating a write fail to the controller 120. The controller 120 may determine the write fail based on the notification from the nonvolatile memory device 110.

In the case of a read operation, the nonvolatile memory device 110 may perform a read operation on memory cells and may transmit a result of the read operation to the controller 120. The error correction block 121 of the controller 120 may perform error correction decoding on data transmitted from the nonvolatile memory device 110.

If the error correction decoding is successful, that is, if an error of data is completely corrected, the controller 120 may determine that the read operation is successful. If the error correction decoding fails, that is, if data including an uncorrectable error is present in data, the controller 120 may determine that the read operation fails.

For example, in the case of an erase operation, if an erase operation is completed in the nonvolatile memory device 110, the controller 120 may determine that the erase operation is successful. If the erase operation of memory cells fails in the nonvolatile memory device 110 without completion, the nonvolatile memory device 110 may transmit a notification indicating an erase fail to the controller 120. The controller 120 may determine the erase fail based on the notification from the nonvolatile memory device 110.

In operation S130, the controller 120 may read reference memory cells related to memory cells. The reference memory cells may have the same structure as the memory cells and may be accessed in the same manner as the memory cells. The reference memory cells may be a part of the memory cells. The memory cells may be used to store user data, but the reference memory cells may be used to store reference data having a specific threshold voltage range.

The reference data stored in the reference memory cells may include specific patterns that are known. Since the data stored in the reference memory cells are known, the controller 120 may detect a characteristic change of the reference data stored in the reference memory cells from a read operation of the reference memory cells. In operation S140, the bad area determiner 123 of the controller 120 may determine a bad area depending on a result of the read operation of the reference memory cells.

For example, the controller 120 may determine a type of an access fail depending on a characteristic change of first reference data stored in first reference memory cells related to first memory cells where an access fail occurs and may determine a bad area. The controller 120 may determine the type of the access fail and the bad area by comparing a characteristic or the characteristic change of the first reference data stored in the first reference memory cells and a characteristic or a characteristic change of second reference data stored in second reference memory cells different from the first reference memory cells.

The controller 120 may determine the type of the access fail and the bad area by comparing a characteristic or the characteristic change of the first reference data stored in the first reference memory cells related to the first memory cells where the access fail occurs and a characteristic or a characteristic change of data stored in second memory cells different from the first memory cells.

In an embodiment, in operation S130 and operation S140, the controller 120 may transmit a special command for determination of a fail type to the nonvolatile memory device 110. The nonvolatile memory device 110 may perform two or more read operations (e.g., read operations of the reference memory cells) for determining a fail type in response to the special command. The nonvolatile memory device 110 may transmit a result of the read operations to the controller 120. The controller 120 may determine a bad area depending on the result of the read operations.

For example, the nonvolatile memory device 110 may perform two or more read operations (e.g., read operations of the reference memory cells) for determining a fail type in response to the special command. The nonvolatile memory device 110 may automatically determine a type of an access fail and may transmit the type of the access fail to the controller 120. The controller 120 may determine a bad area depending on the type of the access fail.

For example, the controller 120 may transmit a read command to the nonvolatile memory device 110. The nonvolatile memory device 110 may perform a read operation (e.g., a read operation on the reference memory cells) in response to the read command and may transmit a result of the read operation to the controller 120. If necessary, the controller 120 may transmit two or more read commands to the nonvolatile memory device 110. The controller 120 may determine a fail type and a bad area depending on a result of a read operation or a combination of results of read operations.

In operation S150, the flash translation layer 122 of the controller 120 may perform a bad area process. For example, the flash translation layer 122 may inhibit a write or erase operation with respect to the bad area. The flash translation layer 122 may move valid data, which is readable, of data stored in the bad area to another storage space of the nonvolatile memory device 110.

If a logical address previously mapped to the bad area exists, the flash translation layer 122 may remap the logical address to another storage space of the nonvolatile memory device 110. The flash translation layer 122 may inhibit the bad area from being used as a user area or a reserved area.

Figure 3:
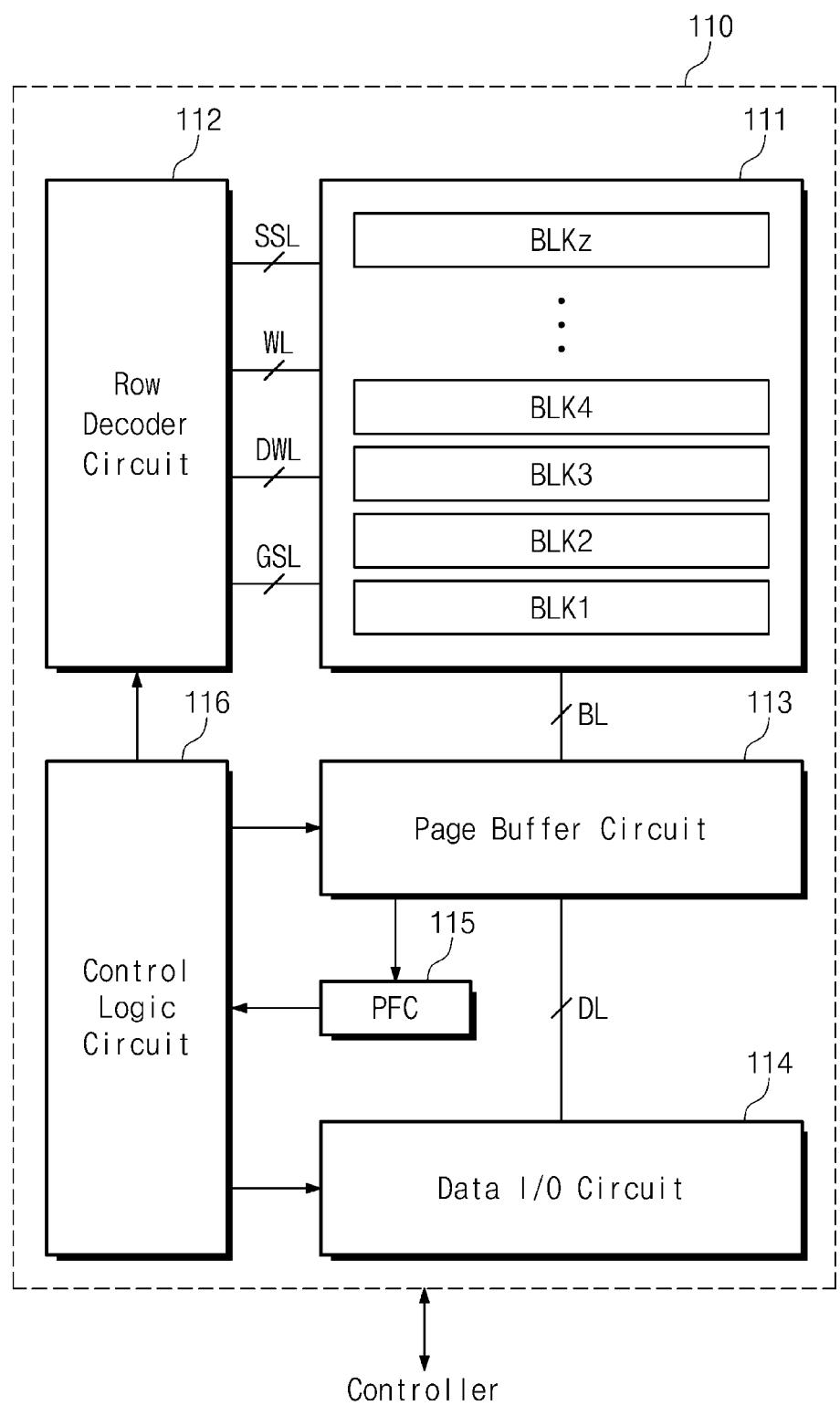
FIG. 3 is a block diagram illustrating a nonvolatile memory device according to an embodiment of the disclosure.

FIG. 3 is a block diagram illustrating the nonvolatile memory device 110 according to an embodiment of the disclosure. Referring to FIGS. 1 and 3, the nonvolatile memory device 110 includes a memory cell array 111, a row decoder circuit 112, a page buffer circuit 113, a data input/output circuit 114, a pass-fail check circuit (PFC) 115, and a control logic circuit 116.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 112 through at least one ground selection line GSL, dummy word lines DWL, word lines WL, and at least one string selection line SSL.

Each of the memory blocks BLK1 to BLKz may be connected to the page buffer circuit 113 through a plurality of bit lines BL. The plurality of memory blocks BLK1 to BLKz may be connected in common to the plurality of bit lines BL. The memory cells of the plurality of memory blocks BLK1 to BLKz may have the same structure.

In an embodiment, each of the memory blocks BLK1 to BLKz may correspond to a unit of an erase operation. The memory cells of the memory cell array 111 may be erased for each memory block. The memory cells belonging to one memory block may be erased at the same time. As another example, each of the memory blocks BLK1 to BLKz may be divided into a plurality of sub-blocks. Each of the plurality of sub-blocks may correspond to a unit of an erase operation.

In an embodiment, each of the plurality of memory blocks BLK1 to BLKz may include a physical storage space which is identified by a block address. Each of the word lines WL may correspond to a physical storage space that is identified by a row address. Each of the plurality of bit lines BL may correspond to a physical storage space that is identified by a column address.

In an embodiment, each of the plurality of memory blocks BLK1 to BLKz may include a plurality of physical pages, each of which includes a plurality of memory cells. Each of the plurality of physical pages may refer to a unit of a program operation. Memory cells of each physical page may be simultaneously programmed Each physical page may include a plurality of logical pages.

Bits that are respectively programmed in memory cells of each physical page may constitute logical pages. First bits that are programmed in memory cells of each physical page may constitute a first logical page. K-th bits (K being a positive integer) that are programmed in the memory cells of each physical page may constitute a k-th logical page.

The row decoder circuit 112 is connected to the memory cell array 111 through a plurality of ground selection lines GSL, a plurality of dummy word lines DWL, the word lines WL, and a plurality of string selection lines SSL. The row decoder circuit 112 operates under control of the control logic circuit 116.

The row decoder circuit 112 may decode an address received from the controller 120 through a first channel (e.g., an input/output channel) and may control voltages to be applied to the string selection lines SSL, the dummy word lines DWL, the word lines WL, and the ground selection lines GSL depending on the decoded address.

For example, in a write operation, the row decoder circuit 112 may apply a program voltage to a selected word line of a memory block selected by an address and may apply a pass voltage to unselected word lines of the selected memory block. The row decoder circuit 112 may apply a turn-off voltage to the ground selection line GSL of the selected memory block and may apply a turn-on voltage to the dummy word lines DWL and the string selection lines SSL.

In a read operation, the row decoder circuit 112 may apply a selection read voltage to a selected word line of a memory block selected by an address and may apply a non-selection read voltage to unselected word lines of the selected memory block. The row decoder circuit 112 may apply the turn-on voltage to the ground selection line GSL, the dummy word lines DWL, and the string selection lines SSL of the selected memory block.

In an erase operation, the row decoder circuit 112 may apply erase voltages (e.g., a ground voltage or low voltages, the levels of which are similar to that of the ground voltage) to word lines of a memory block selected by an address. The row decoder circuit 112 may float the ground selection line GSL, the dummy word lines DWL, and the string selection lines SSL of the selected memory block.

The page buffer circuit 113 is connected to the memory cell array 111 through the plurality of bit lines BL. The page buffer circuit 113 is connected with the data input/output circuit 114 through a plurality of data lines DL. The page buffer circuit 113 operates under control of the control logic circuit 116.

In the write operation, the page buffer circuit 113 may store data to be written in memory cells. The page buffer circuit 113 may apply voltages to the plurality of bit lines BL based on the stored data. In a verification read operation associated with the read operation, the write operation, or the erase operation, the page buffer circuit 113 may sense voltages of the bit lines BL and may store a result of the sensing operation.

The data input/output circuit 114 is connected with the page buffer circuit 113 through the plurality of data lines DL. The data input/output circuit 114 may output data read by the page buffer circuit 113 to the controller 120 through an input/output channel and may transmit data received from the controller 120 through the input/output channel to the page buffer circuit 113.

After the verification read operation associated with the write operation or the erase operation, the pass-fail check circuit 115 may receive the sensing result from the page buffer circuit 113. The pass-fail check circuit 115 may determine pass or fail of the write or erase operation based on the received sensing result.

For example, in the verification read operation associated with the write operation, the page buffer circuit 113 may count the number of on-cells that are turned on. If the number of on-cells is not smaller than a threshold value, the pass-fail check circuit 115 may determine that the write operation fails (e.g., write fail). If the number of on-cells is smaller than the threshold value, the pass-fail check circuit 115 may determine that the write operation is successful (e.g., write pass).

For example, during the verification read operation associated with the erase operation, the page buffer circuit 113 may count the number of off-cells that are turned off. If the number of off-cells is not smaller than a threshold value, the pass-fail check circuit 115 may determine that the erase operation fails (e.g., erase fail). If the number of off-cells is smaller than the threshold value, the pass-fail check circuit 115 may determine that the erase operation is successful (e.g., erase pass). A result of the pass or fail determination is provided to the control logic circuit 116.

The control logic circuit 116 may receive a command through the first channel and a control signal through a second channel (a control channel) from the controller 120. The control logic circuit 116 may receive the command input through the first channel in response to the control signal, may route an address received through the second channel to the row decoder circuit 112, and may route data received through the first channel to the data input/output circuit 114.

The control logic circuit 116 may decode the received command and may control the nonvolatile memory device 110 depending on the decoded command. In the verification read operation associated with the write operation or the erase operation, the control logic circuit 116 may receive the pass or fail determination result from the pass-fail check circuit 115.

The control logic circuit 116 may repeat a loop of the write operation or the erase operation while stepwise increasing a level of the program voltage or the erase voltage. The control logic circuit 116 may repeat a loop of the write operation or the erase operation until a pass result is received from the pass-fail check circuit 115.

If the fail result is received from the pass-fail check circuit 115 until the loop of the write operation or the erase operation is performed as much as a maximum loop value defined in advance, the control logic circuit 116 may determine that the write operation or the erase operation finally fails. The control logic circuit 116 may notify the controller 120 that the write operation or the erase operation fails, through the first channel or the second channel.

Figure 4:
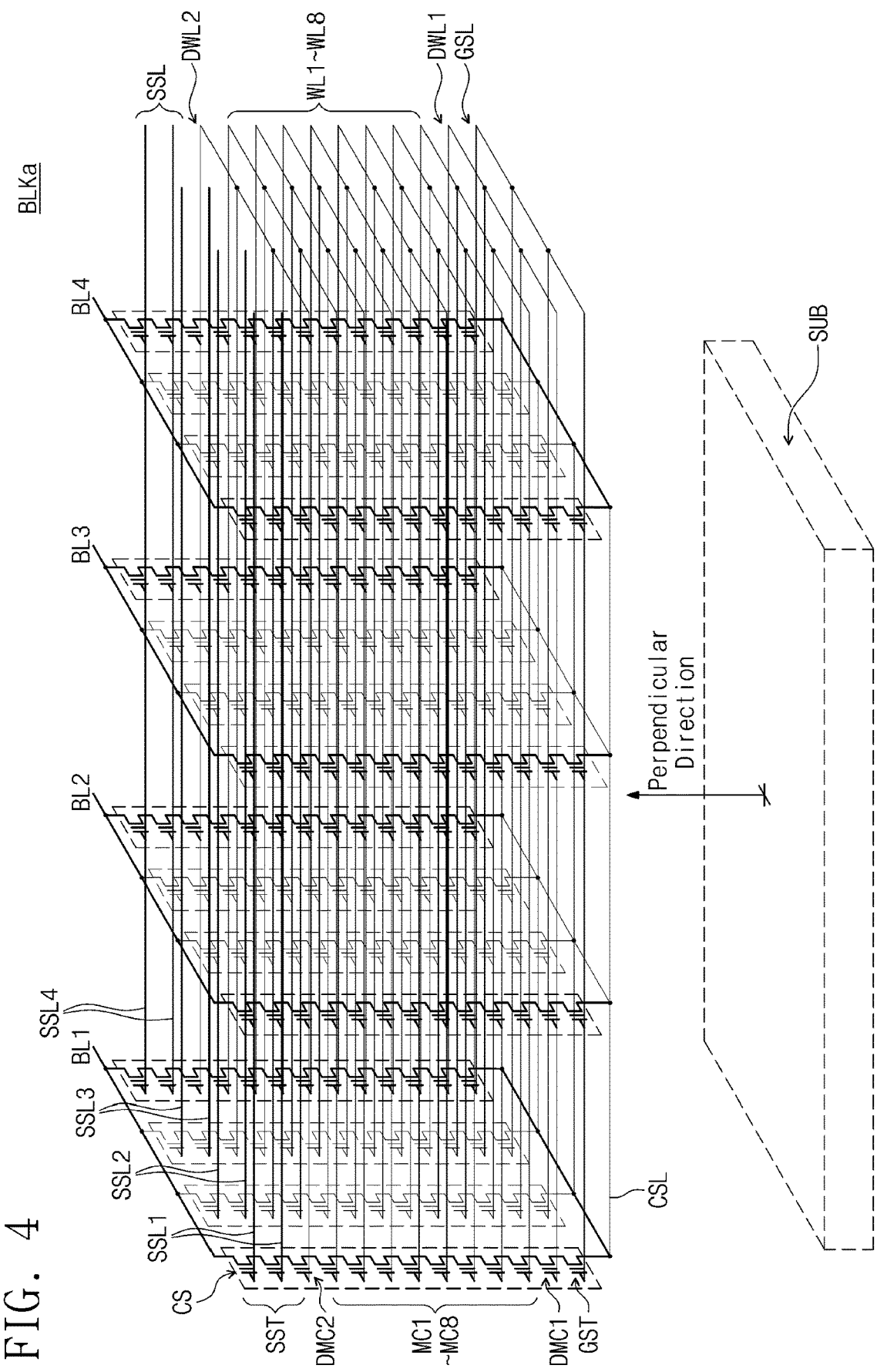
FIG. 4 is a circuit diagram illustrating an example of one memory block of memory blocks of FIG. 3.

FIG. 4 is a circuit diagram of an example of one memory block BLKa of the memory blocks BLK1 to BLKz of FIG. 3. Referring to FIG. 4, a plurality of cell strings CS may be disposed on a substrate SUB in rows and columns. The plurality of cell strings CS may be connected in common to a common source line CSL that is formed on (or in) the substrate SUB. In FIG. 4, a location of the substrate SUB is illustrated to help understand a structure of the memory block BLKa.

An example is illustrated in FIG. 4 as the common source line CSL is connected to lower ends of the cell strings CS. However, it is sufficient that the common source line CSL is electrically connected to the lower ends of the cell strings CS, and the disclosure is not limited to the case that the common source line CSL is physically located at the lower ends of the cell strings CS. An example is illustrated in FIG. 4 as the cell strings CS are arranged in a four-by-four matrix. However, the number of cell strings CS in the memory block BLKa may increase or decrease.

Cell strings CS of each row may be connected to the ground selection line GSL and to corresponding string selection lines of first to fourth string selection lines SSL1 to SSL4. Cell strings CS of each column may be connected to a corresponding bit line of first to fourth bit lines BL1 to BL4. For ease of illustration, cell strings CS that are connected to the second and third string selection lines SSL2 and SSL3 are depicted to be light.

Each cell string CS may include at least one ground selection transistor GST connected to the ground selection line GSL, a first dummy memory cell DMC1 connected to a first dummy word line DWL1, a plurality of memory cells MC1 to MC8 respectively connected to a plurality of word lines WL1 to WL8, a second dummy memory cell DMC2 connected to a second dummy word line DWL2, and string selection transistors SST respectively connected to the string selection lines SSL1, SSL2, SSL3, or SSL4.

In each cell string CS, the ground selection transistor GST, the first dummy memory cell DMC1, the memory cells MC1 to MC8, the second dummy memory cell DMC2, and the string selection transistors SST may be serially connected along a direction perpendicular to the substrate SUB and may be sequentially stacked along the direction perpendicular to the substrate SUB.

In each cell string CS, one or more dummy memory cells may be provided between the memory cells MC1 to MC8. The dummy memory cells DMC1 and DMC2 may have the same structure as the memory cells MC1 to MC8. The dummy memory cells DMC1 and DMC2 may not be programmed (e.g., may be program-inhibited) or may be programmed to be different from the memory cells MC1 to MC8.

For example, the memory cells MC1 to MC8 may be programmed to have various threshold voltages depending on data, and the dummy memory cells DMC1 and DMC2 may be programmed to have threshold voltages in a specific range. As in the dummy memory cells DMC1 and DMC2, the string selection transistors SST and the ground selection transistors GST may be programmed to have threshold voltages in a specific range.

In an embodiment, memory cells that are located at the same height and are associated with one string selection line SSL1, SSL2, SSL3, or SSL4 may form one physical page. Memory cells of one physical page may be connected to one sub-word line. Sub-word lines of physical pages located at the same height may be connected in common to one word line.

In an embodiment, sub-word lines of physical pages located at the same height may be connected to each other at a height at which the sub-word lines are formed. For another example, sub-word lines of physical pages located at the same height may be indirectly connected to each other in another layer, the height of which is different from the height at which the sub-word lines are formed, such as a metal layer.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the disclosure, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Some memory cells of the memory cells MC1 to MC8 may be used as reference memory cells. The reference memory cells may not be used to store user data, but they may be used to store reference data. The reference data may have a pattern that is easy to monitor a change in a threshold voltage.

Figure 5:
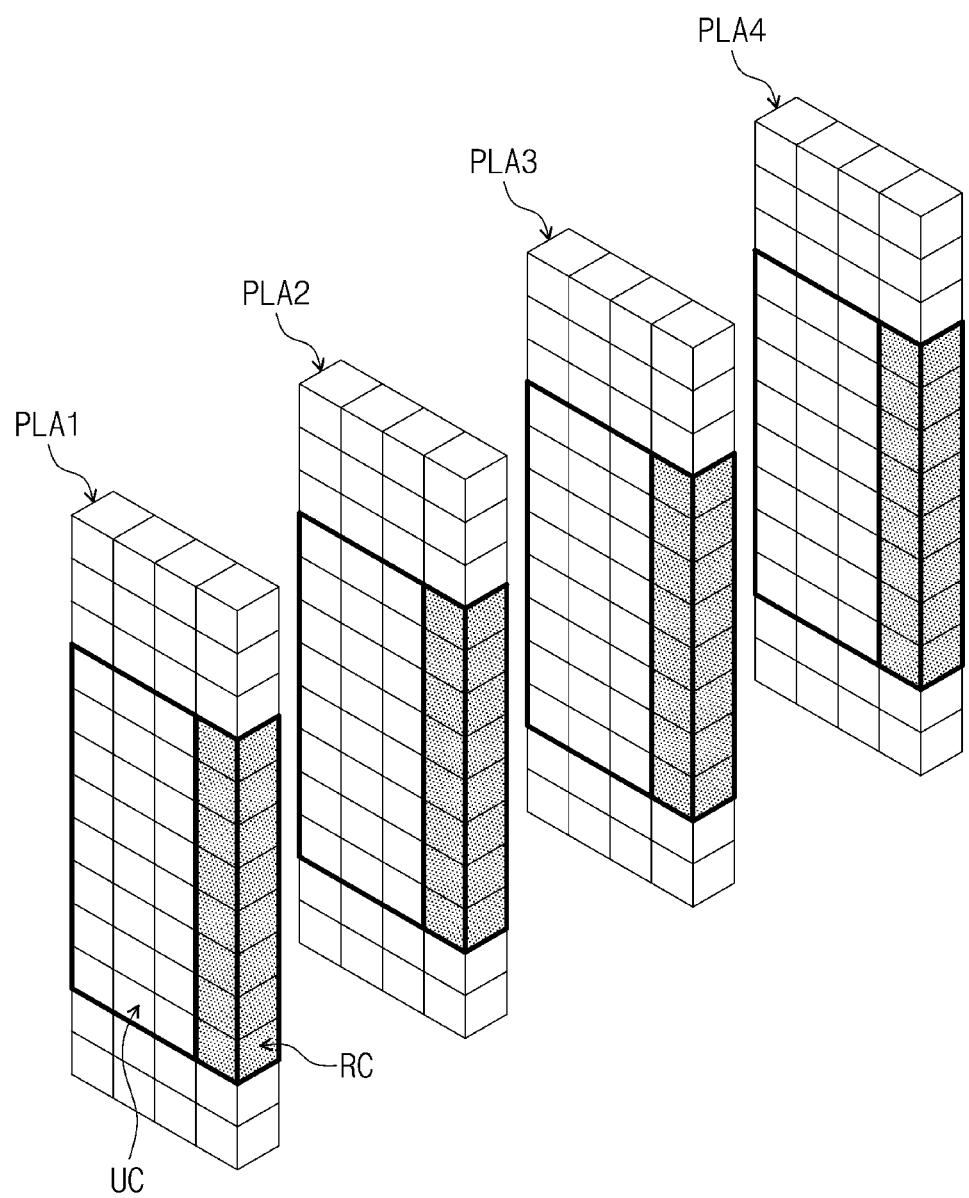
FIG. 5 illustrates cell transistors of a memory block of FIG. 4.

In an embodiment, memory cells, which are used to store user data, from among the memory cells MC1 to MC8 may be user memory cells UC (refer to FIG. 5). Memory cells, which are used to store the reference data, from among the memory cells MC1 to MC8 may be reference memory cells RC. In an embodiment, memory cells may be interpreted as substantially equivalent to the user memory cells UC in that only the user memory cells UC of the memory cells MC1 to MC8 are used to store user data.

FIG. 5 illustrates cell transistors of the memory block BLKa of FIG. 4. A plurality of hexahedrons is illustrated in FIG. 5. Each hexahedron of FIG. 5 may indicate one cell transistor. One cell transistor may be a ground selection transistor GST, a dummy memory cell DMC, a memory cell MC, or a string selection transistor SST.

Referring to FIGS. 4 and 5, cell transistors may form first to fourth planes PLA1 to PLA4. The first plane PLA1 includes cell transistors associated with the first string selection line SSL1. The second plane PLA2 includes cell transistors associated with the second string selection line SSL2.

The third plane PLA3 includes cell transistors associated with the third string selection line SSL3. The fourth plane PLA4 includes cell transistors associated with the fourth string selection line SSL4. For ease of illustration, the ground selection line GSL, the dummy word lines DWL1 and DWL2, the word lines WL1 to WL8, the string selection lines SSL1 to SSL4, and the bit lines BL1 to BL4 are not illustrated in FIG. 5.

In FIG. 5, cell transistors surrounded by a bold line indicate the memory cells MC1 to MC8. In the memory cells MC1 to MC8, the user memory cells UC are depicted with an empty hexahedron, and the reference memory cells RC are depicted with a dot-filled hexahedron. In an embodiment, some memory cells of each physical page may be used as the reference memory cells RC.

Figure 6:
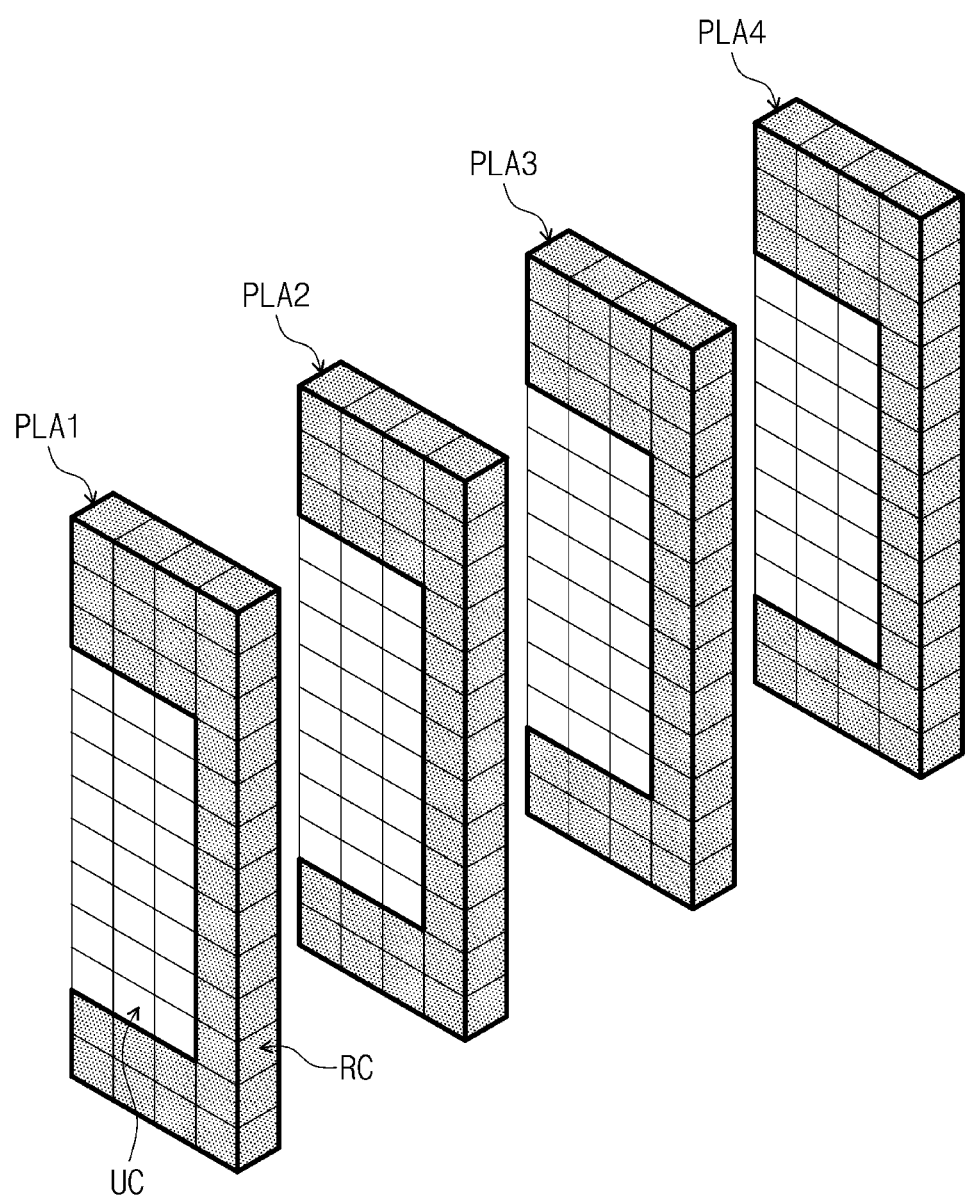
FIG. 6 illustrates another example of cell transistors of a memory block of FIG. 4.

FIG. 6 illustrates another example of cell transistors of the memory block BLKa of FIG. 4. Each hexahedron of FIG. 6 may indicate one cell transistor. Compared with FIG. 5, the reference memory cells RC may further include the ground selection transistors GST, the dummy memory cells DMC1 and DMC2, or the string selection transistors SST.

The ground selection transistors GST, the dummy memory cells DMC1 and DMC2, or the string selection transistors SST may be programmed to have a threshold voltage in a specific range. When threshold voltages of the user memory cells UC or the reference memory cells RC change, threshold voltages of the ground selection transistors GST, the dummy memory cells DMC1 and DMC2, or the string selection transistors SST may also change.

Accordingly, the threshold voltages of the ground selection transistors GST, the dummy memory cells DMC1 and DMC2, or the string selection transistors SST may also be used to determine a type of an access fail.

Figure 7:
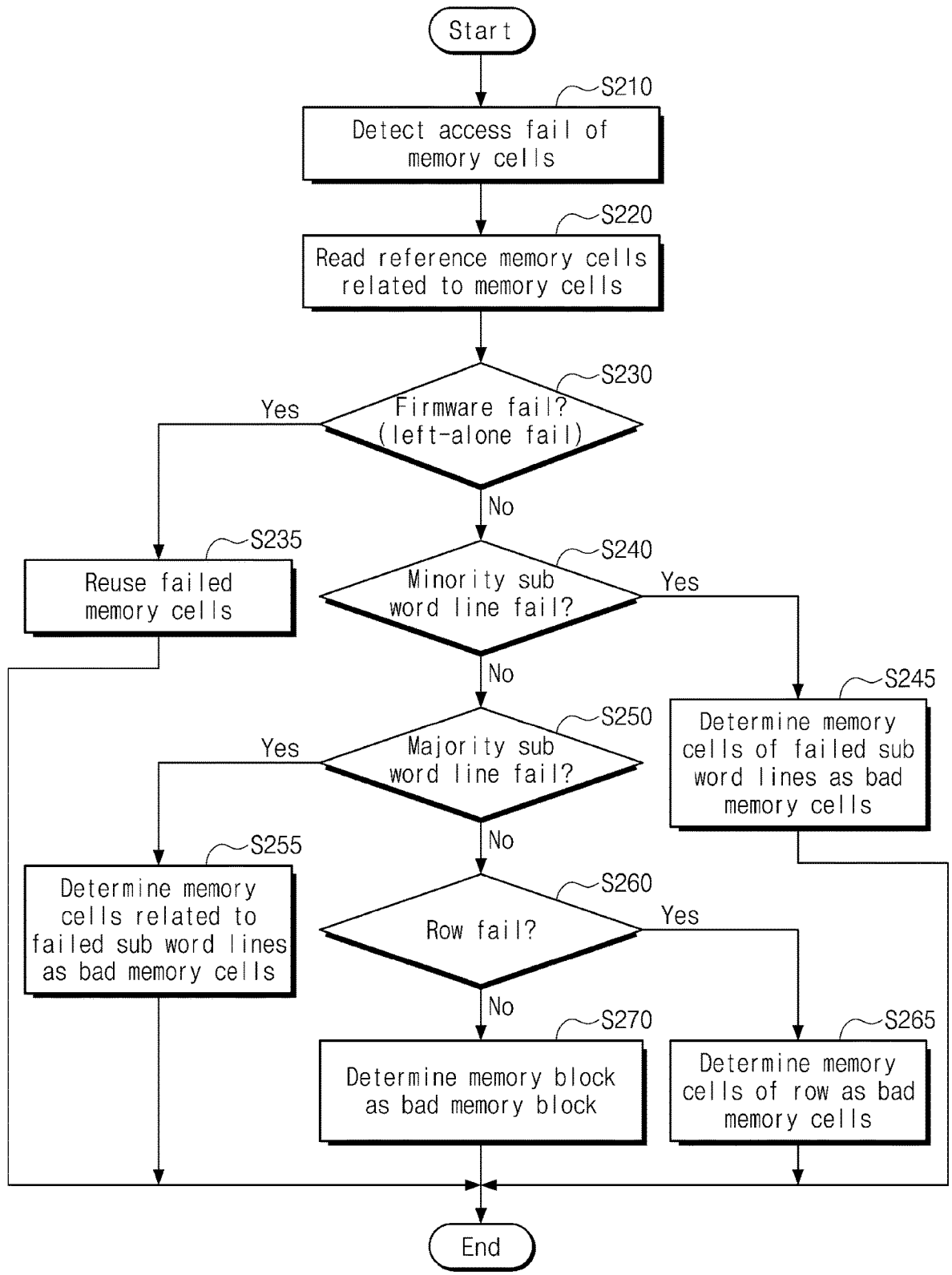
FIG. 7 is a flowchart illustrating a method of determining a bad area.

FIG. 7 is a flowchart illustrating a method (operation S130 and operation S140) of determining a bad area. Referring to FIGS. 1, 3, 4, and 7, in operation S210, the controller 120 may detect an access fail of memory cells. In operation S220, the controller 120 may read reference memory cells related to memory cells where the access fail occurs.

In operation S230, the bad area determiner 123 of the controller 120 may determine whether the access fail is a firmware fail. For example, cell transistors may experience disturbance of threshold voltages due to a read operation or a write operation. Also, the threshold voltages of the cell transistors may gradually vary over time.

To compensate for the disturbance of the threshold voltages of the cell transistors or a change over time in the threshold voltages of the cell transistors, firmware of the controller 120 is configured to readjust the threshold voltages of the cell transistors. If the firmware of the controller 120 does not readjust threshold voltages at an appropriate time (or by the time appointed) and, thus, the cell transistors are left alone, the threshold voltages of the cell transistors may exceed a threshold value.

If the threshold voltages of the cell transistors exceed the threshold value, the access fail may occur upon accessing memory cells (or user memory cells) related to the cell transistors. Such a fail may be a left-alone fail. The left-alone fail occurs due to an abnormal operation of the firmware of the controller 120, not due to the defect of the cell transistors.

Accordingly, if the access fail is the left-alone fail, in operation S235, the bad area determiner 123 may determine that the bad area does not exist. The controller 120 may reuse the memory cells (hereinafter referred to as "failed memory cells") where the access fail occurs. For example, the controller 120 may move valid data of a memory block, to which the failed memory cells belong, to another memory block. Afterwards, the controller 120 may erase and reuse the memory block of the failed memory cells.

If it is determined in operation S230 that the access fail is not the left-alone fail, operation S240 is performed. In operation S240, the bad area determiner 123 may determine whether the access fail is a minority sub-word line fail. For example, the bad area determiner 123 may determine whether the access fail occurs due to the defect of minority sub-word lines or memory cells related to the minority sub-word lines.

The minority sub-word lines may be one or more sub-word lines among sub-word lines connected with one word line, the number of which is less than a specific ratio (e.g., half), from among the sub-word lines connected to one word line. If the access fail is the minority sub-word line fail, in operation S245, the bad area determiner 123 may determine memory cells of the minority sub-word lines corresponding to the access fail as bad memory cells (i.e., a bad area).

If it is determined in operation S240 that the access fail is not the minority sub-word line fail, operation S250 is performed. In operation S250, the bad area determiner 123 may determine whether the access fail is a majority sub-word line fail. For example, the bad area determiner 123 may determine whether the access fail occurs due to the defect of majority sub-word lines or memory cells related to the majority sub-word lines.

The majority sub-word lines may be all sub-word lines connected with one word line or one or more sub-word lines, the number of which is not less than a specific ratio (e.g., half), from among the sub-word lines connected to one word line. If the access fail is the majority sub-word line fail, in operation S255, the bad area determiner 123 may determine memory cells of the majority sub-word lines corresponding to the access fail as bad memory cells (i.e., a bad area). For example, the bad area determiner 123 may determine all memory cells of a word line, to which the majority sub-word lines belong, as bad memory cells.

If it is determined in operation S250 that the access fail is not the majority sub-word line fail, operation S260 is performed. In operation S260, the bad area determiner 123 may determine whether the access fail is a row fail. For example, the bad area determiner 123 may determine whether the access fail occurs due to the defect of a string selection line or string selection transistors related to (e.g., of the same row as) the memory cells corresponding to the access fail.

If the access fail is the row fail, in operation S265, the bad area determiner 123 may determine the whole row (e.g., a plane), to which memory cells corresponding to the access fail belong, as a bad area. If the access fail is not the row fail, in operation S270, the bad area determiner 123 may determine the whole memory block (e.g., the whole sub-block), to which memory cells corresponding to the access fail belong, as a bad area.

Examples of the left-alone fail, the minority sub-word line fail, the majority sub-word line fail, and the row fail are described with reference to FIG. 7. However, fail types that are able to be determined through reference memory cells are not limited thereto. The bad area determiner 123 may variously determine a fail type by using the reference memory cells.

The bad area determiner 123 may differently determine a bad area depending on the determined fail type. In the case where the bad area determiner 123 cannot determine the fail type, the bad area determiner 123 may determine the whole memory block (e.g., the whole sub-block), to which memory cells corresponding to the access fail belong, as a bad area.

Figure 8:
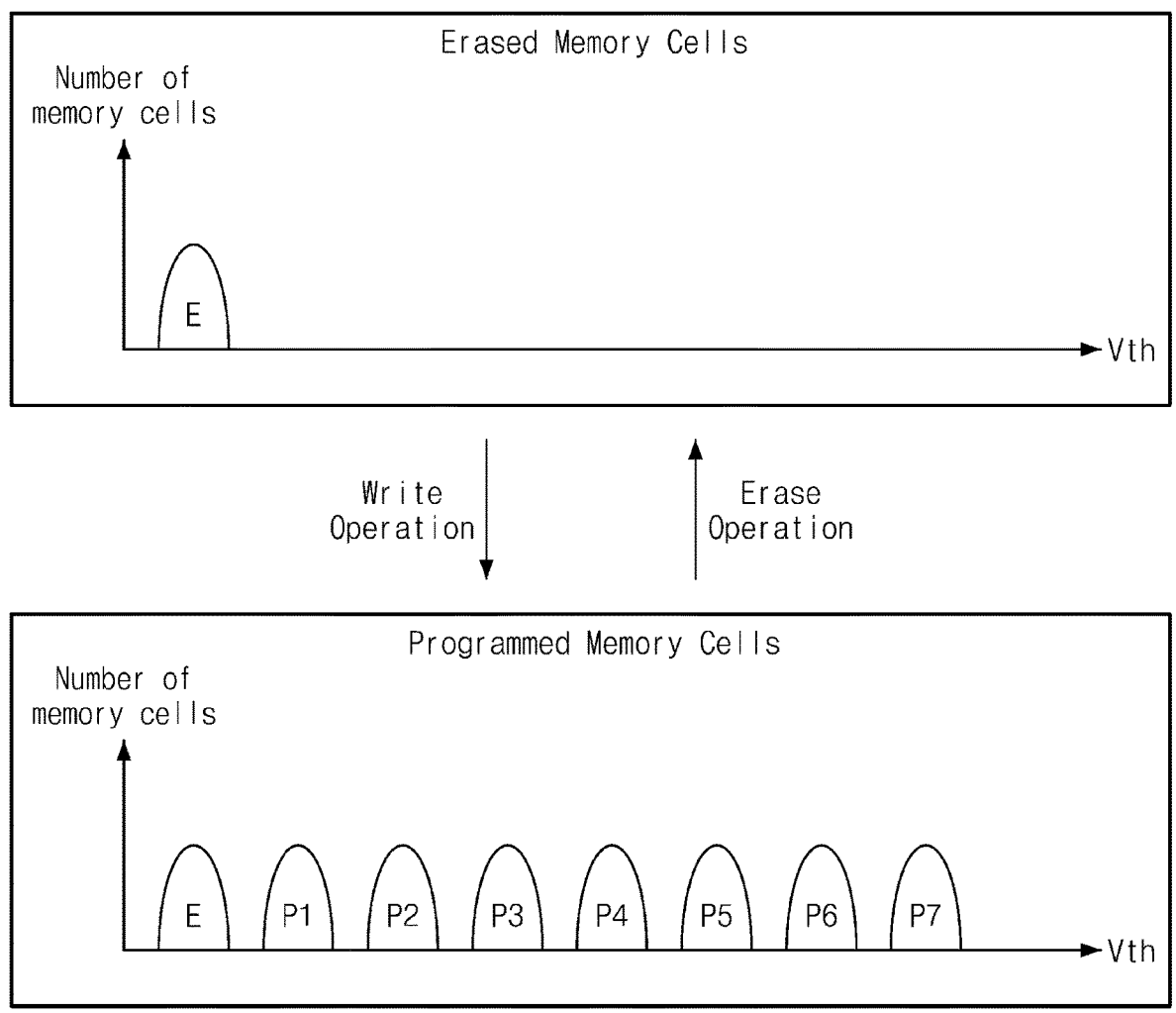
FIG. 8 illustrates an example of a change in threshold voltages of memory cells due to a write operation and an erase operation.

FIG. 8 illustrates an example of a change in threshold voltages of memory cells due to a write operation and an erase operation. In FIG. 8, a horizontal axis represents threshold voltages of memory cells MC, and a vertical axis represents the number of memory cells.

Erased memory cells have threshold voltages of an erase state "E". Programmed memory cells may have threshold voltages of the erase state "E" and first to seventh program states P1 to P7.

In an embodiment, the number of program states that programmed memory cells have is not limited thereto. The number of program states that programmed memory cells have may be determined depending on the number of bits to be written in each memory cell.

Figure 9:
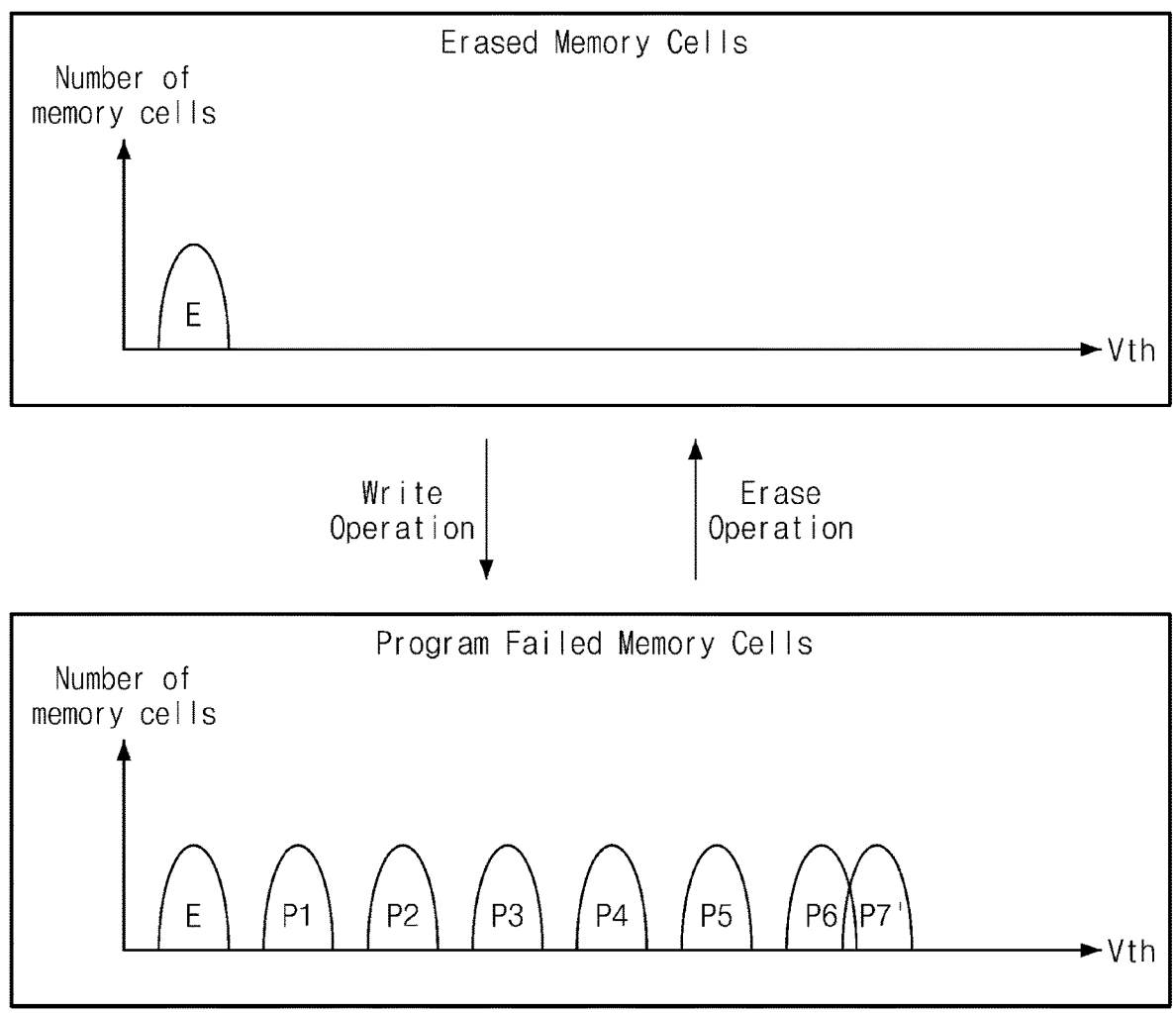
FIG. 9 illustrates threshold voltage distributions of memory cells when a write operation fails.

FIG. 9 illustrates threshold voltage distributions of memory cells when a write operation fails. In FIG. 9, a horizontal axis represents threshold voltages of memory cells MC, and a vertical axis represents the number of memory cells. Compared with FIG. 8, a threshold voltage distribution P7' of memory cells programmed to the seventh program state P7 may be formed to be lower than a target level.

In an embodiment, when a write operation fails, in addition to the threshold voltage distribution P7' of memory cells programmed to the seventh program state P7, a threshold voltage distribution of memory cells programmed to any other program state may also be formed to be lower than a target level.

Figure 10:
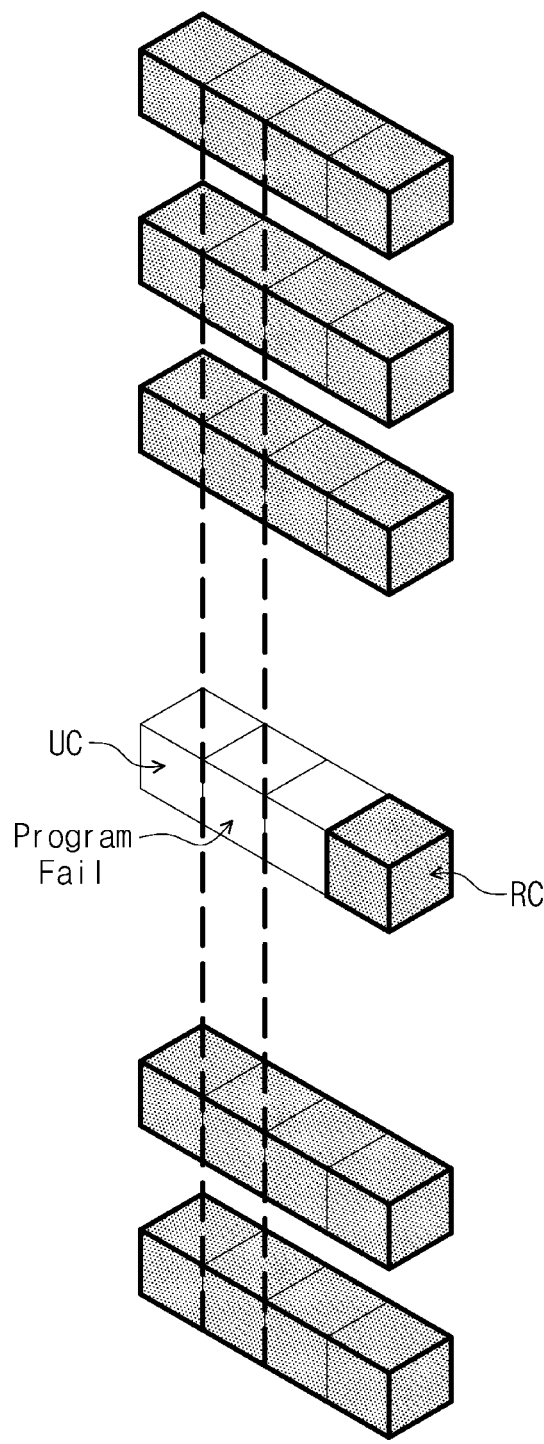
FIG. 10 illustrates an example of reading reference memory cells when a write fail occurs in a user memory cell.
Figure 11:
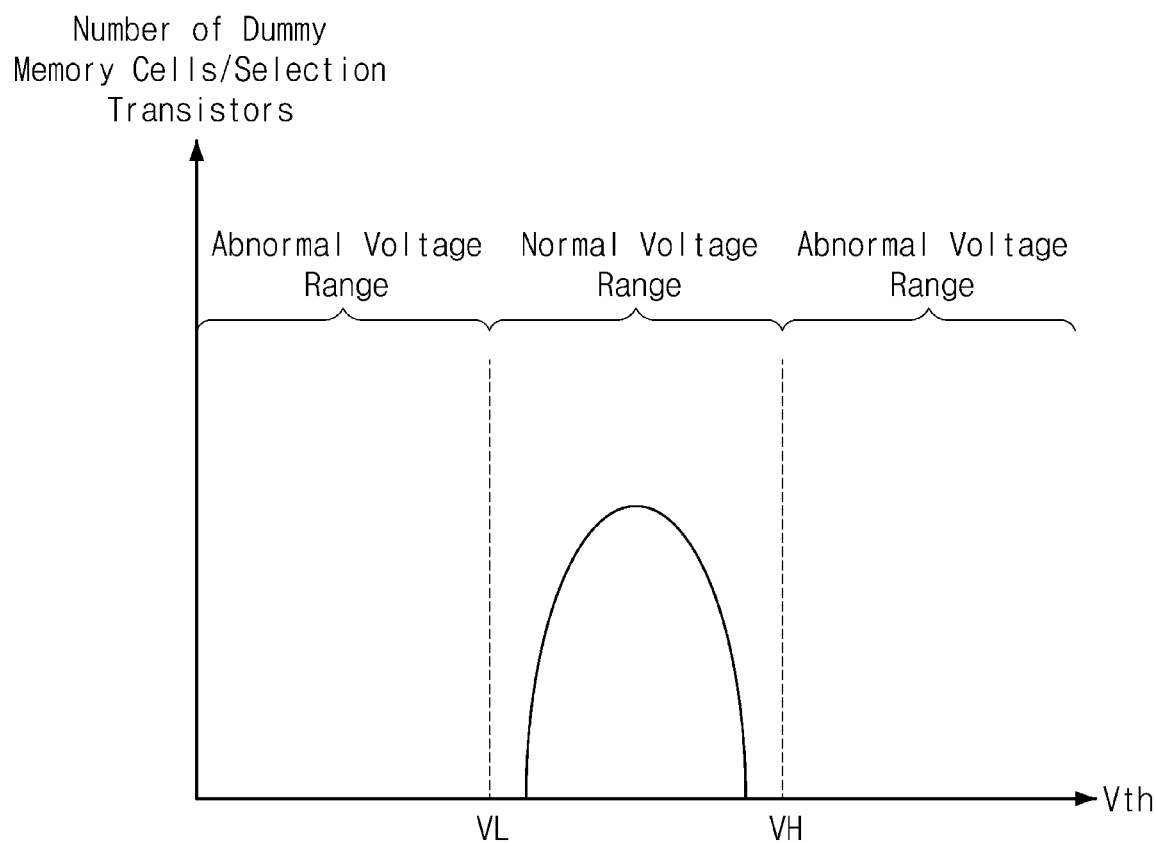
FIG. 11 illustrates an example of a threshold voltage distribution of a ground selection transistor, dummy memory cells, or string selection transistors.

FIGS. 10 and 11 illustrate an example of determining whether an access fail is a left-alone fail when a write fail occurs. In detail, FIG. 10 shows an example of reading the reference memory cells RC when a write fail occurs in a user memory cell UC.

Referring to FIGS. 4 and 11, when a write fail occurs in a specific user memory cell UC, the controller 120 may read the ground selection transistor GST, the dummy memory cells DMC1 and DMC2, or the string selection transistors SST, which belong to the same cell string as the specific user memory cell UC, as the reference memory cells RC.

FIG. 11 shows an example of a threshold voltage distribution of the ground selection transistor GST, the dummy memory cells DMC1 and DMC2, or the string selection transistors SST. In FIG. 11, a horizontal axis represents a threshold voltage Vth, and a vertical axis represents the number of ground selection transistors GST, dummy memory cells DMC1 and DMC2, or string selection transistors SST.

Referring to FIGS. 1, 4, 10, and 11, an upper voltage VH and a lower voltage VL form a normal voltage range. For example, the ground selection transistor GST, the dummy memory cells DMC1 and DMC2, or the string selection transistors SST may operate normally when having a threshold voltage between the upper voltage VH and the lower voltage VL.

If threshold voltages of the ground selection transistor GST, the dummy memory cells DMC1 and DMC2, or the string selection transistors SST are higher than the upper voltage VH or is lower than the lower voltage VL, the ground selection transistor GST, the dummy memory cells DMC1 and DMC2, or the string selection transistors SST may operate abnormally.

As described above, the controller 120 may control threshold voltages of the ground selection transistor GST, the dummy memory cells DMC1 and DMC2, or the string selection transistors SST so as not to change from a normal voltage range to an abnormal voltage range. If the threshold voltages of the ground selection transistor GST, the dummy memory cells DMC1 and DMC2, or the string selection transistors SST change to the abnormal voltage range, the access fail may occur.

When a write fail occurs, the bad area determiner 123 may determine whether the ground selection transistor GST, the dummy memory cells DMC1 and DMC2, or the string selection transistors SST, which belong to the same cell string as memory cells corresponding to the write fail, belong to an abnormal voltage range.

If the threshold voltages of the ground selection transistor GST, the dummy memory cells DMC1 and DMC2, or the string selection transistors SST belong to the abnormal voltage range, the bad area determiner 123 may determine that the write fail is the left-alone fail. If the threshold voltages of the ground selection transistor GST, the dummy memory cells DMC1 and DMC2, or the string selection transistors SST belong to the normal voltage range, the bad area determiner 123 may determine that the write fail is not the left-alone fail.

In an embodiment, the bad area determiner 123 may transmit, to the nonvolatile memory device 110, a read command for the ground selection transistor GST, the dummy memory cells DMC1 and DMC2, or the string selection transistors SST. The bad area determiner 123 may receive a read result from the nonvolatile memory device 110 and may determine whether the write fail is the left-alone fail.

For another example, the bad area determiner 123 may transmit, to the nonvolatile memory device 110, a special command for requesting the nonvolatile memory device 110 to determine whether the write fail is the left-alone fail. The nonvolatile memory device 110 may read the ground selection transistor GST, the dummy memory cells DMC1 and DMC2, or the string selection transistors SST and may determine whether the write fail is the left-alone fail. The nonvolatile memory device 110 may transmit a result of the determination to the controller 120.

Figure 12:
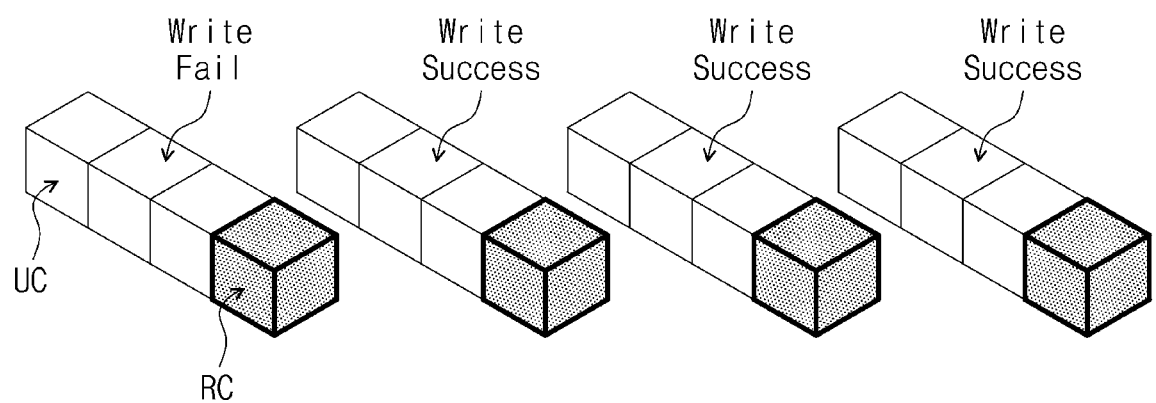
FIG. 12 illustrates an example in which a bad area determiner determines a minority sub-word line fail when a write fail occurs.

FIG. 12 illustrates an example in which the bad area determiner 123 determines a minority sub-word line fail when a write fail occurs. Referring to FIGS. 1, 4, and 12, the bad area determiner 123 may determine whether a write fail further occurs in memory cells that share a word line with memory cells where the write fail occurs.

If the number of sub-word lines, at which an access fail occurs, from among sub-word lines sharing a word line is one or less than a specific ratio (e.g., half), the bad area determiner 123 may determine the access fail as the minority sub-word line fail. The bad area determiner 123 may determine memory cells connected to the sub-word lines where the write fail occurs, as a bad area.

In an embodiment, the controller 120 may perform a write operation on memory cells of second sub-word lines sharing a word line with a first sub-word line where the access fail occurs. The bad area determiner 123 may determine whether the write fail is the minority sub-word line fail, depending on a write result of the second sub-word lines.

In an embodiment, the write fail of the memory cells of the second sub-word lines may be determined by reading reference memory cells. For example, patterns that are written in the user memory cells UC may vary with bit values of user data. Accordingly, even though a defect is present in one of the second sub-word lines, a write operation may succeed depending on the bit values of the user data.

In contrast, reference data that are written in the reference memory cells RC have a fixed pattern. For example, the reference data may have a pattern that is determined in such a way that a threshold voltage distribution of program-failed memory cells of FIG. 9 is easily determined (or verified). Accordingly, it may be possible to easily determine the write fail of the second sub-word lines by reading the reference data.

Figure 13:
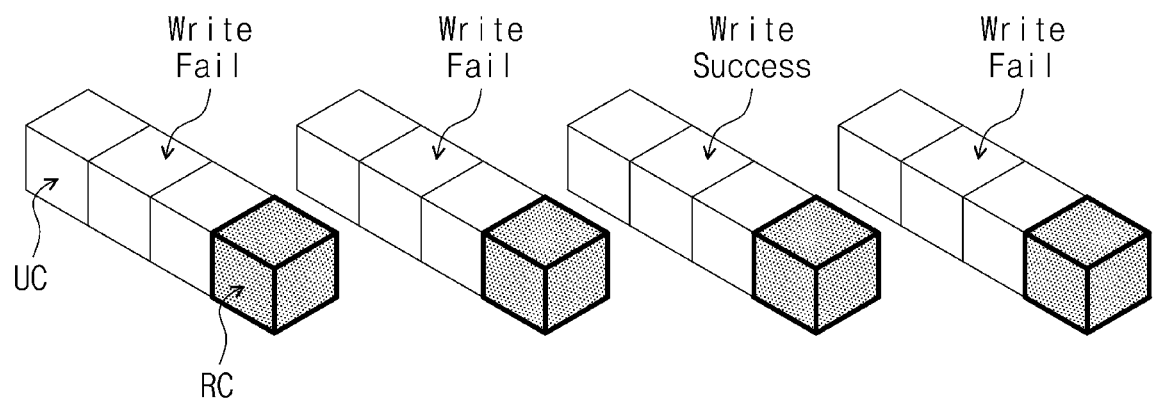
FIG. 13 illustrates an example in which a bad area determiner determines a majority sub-word line fail when a write fail occurs.

FIG. 13 illustrates an example in which the bad area determiner 123 determines a majority sub-word line fail when a write fail occurs. Referring to FIGS. 1, 4, and 13, the bad area determiner 123 may determine whether a write fail further occurs in memory cells that share a word line with memory cells where the write fail occurs.

If the number of sub-word lines, at which an access fail occurs, from among sub-word lines belong a word line is not less than a specific ratio (e.g., half) or an access fail occurs in all the sub-word lines sharing the word line, the bad area determiner 123 may determine the access fail as the majority sub-word line fail. The bad area determiner 123 may determine memory cells connected to the majority sub-word lines where the write fail occurs, as a bad area.

In an embodiment, the controller 120 may perform a write operation on memory cells of second sub-word lines sharing a word line with a first sub-word line where the access fail occurs. The bad area determiner 123 may determine whether the write fail is the majority sub-word line fail, depending on a write result of the second sub-word lines.

As described with reference to FIG. 12, the bad area determiner 123 may read the reference memory cells RC of the second sub-word lines for the purpose of easily determining the write fail of the second sub-word lines. The bad area determiner 123 may determine the write fail of the second sub-word lines depending on a read result of the reference memory cells RC.

Figure 14:
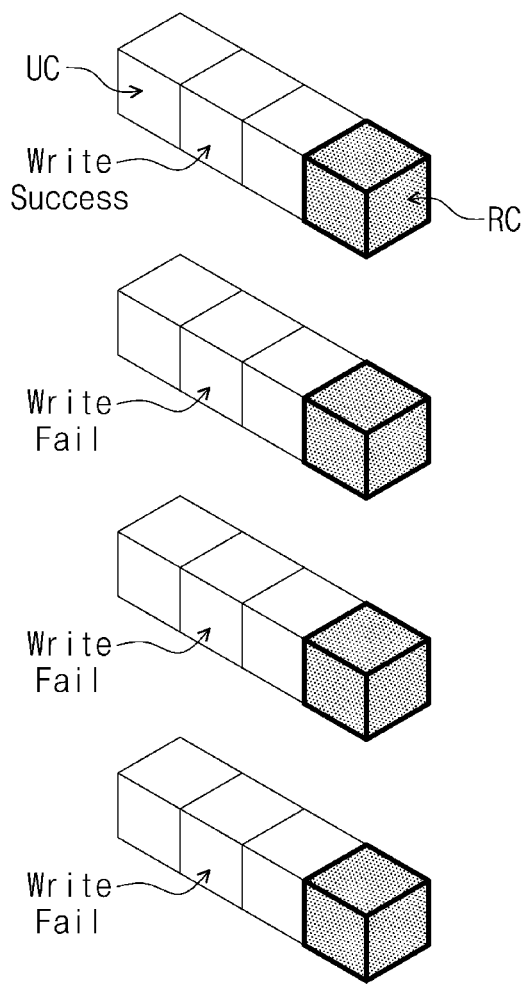
FIG. 14 illustrates an example in which a bad area determiner determines a row fail when a write fail occurs.

FIG. 14 illustrates an example in which the bad area determiner 123 determines a row fail when a write fail occurs. Referring to FIGS. 1, 4, and 14, the bad area determiner 123 may determine whether a write fail further occurs in memory cells belonging to the same row as memory cells where the write fail occurs.

If the number of sub-word lines, at which an access fail occurs, from among sub-word lines belonging to the same row is not less than a specific ratio (e.g., half) or an access fail occurs in all the sub-word lines belonging to the same row, the bad area determiner 123 may determine the row fail. The bad area determiner 123 may determine memory cells belonging to the same row as memory cells where the write fail occurs, as a bad area.

That is, the bad area determiner 123 may refer to other memory cells belonging to the same row as the memory cells where the write fail occurs, as reference memory cells. The bad area determiner 123 may determine the row fail depending on an access result of the other memory cells.

In an embodiment, the controller 120 may perform a write operation on memory cells of second sub-word lines belonging to the same row as a first sub-word line where the access fail occurs. The bad area determiner 123 may determine whether the write fail is the row fail, depending on a write result of the second sub-word lines.

As described with reference to FIG. 12, the bad area determiner 123 may read the reference memory cells RC of the second sub-word lines for the purpose of easily determining the write fail of the second sub-word lines. The bad area determiner 123 may determine the write fail of the second sub-word lines depending on a read result of the reference memory cells RC.

Figure 15:
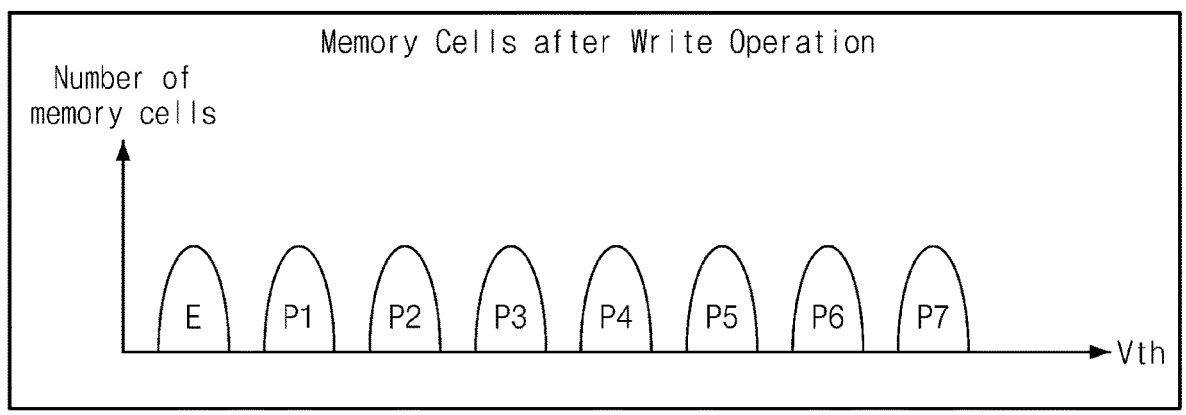
FIG. 15 illustrates an example of a change in threshold voltages of memory cells due to distribution or over time.
Figure 15:
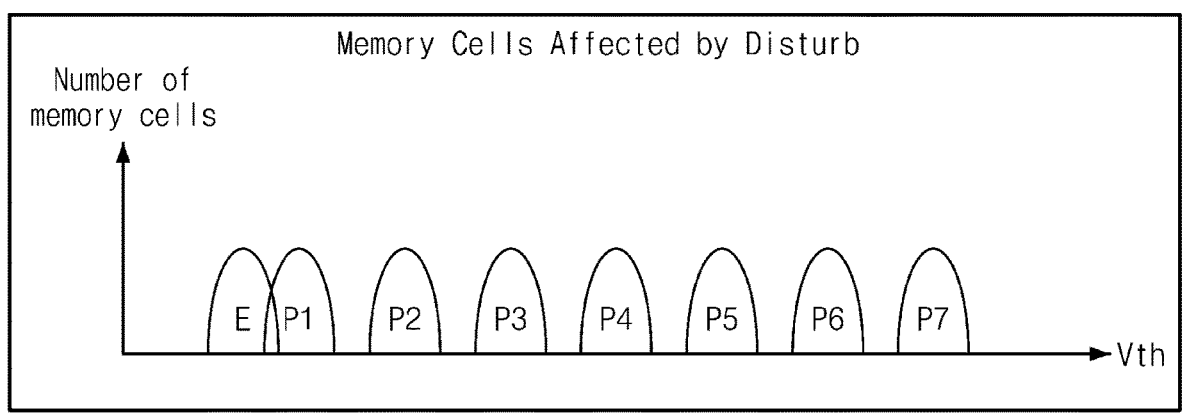
Figure 15:
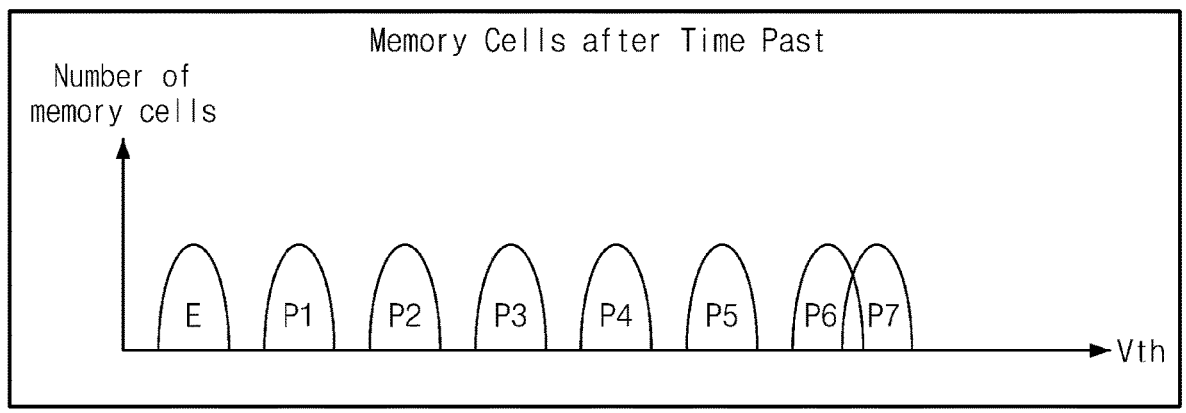

FIG. 15 illustrates an example of a change in threshold voltages of memory cells due to distribution or over time. In FIG. 15, a horizontal axis represents threshold voltages of memory cells MC, and a vertical axis represents the number of memory cells.

Referring to FIGS. 1, 4, and 15, after a write operation, memory cells may have an erase state "E" and first to seventh program states P1 to P7. If memory cells are affected by the disturbance, threshold voltages of memory cells having a relatively low threshold voltage like the erase state "E" increase.

Threshold voltages of memory cells having a relatively high threshold voltage like the seventh program state P7 decrease over time. A read fail may occur in memory cells due to influence of the disturbance or over time. To prevent the read fail, the controller 120 may perform a read reclaim operation of reading data where a specific time elapses after being written or data where an error rate reaches a threshold value and writing the read data in any other memory cells.

Figure 16:
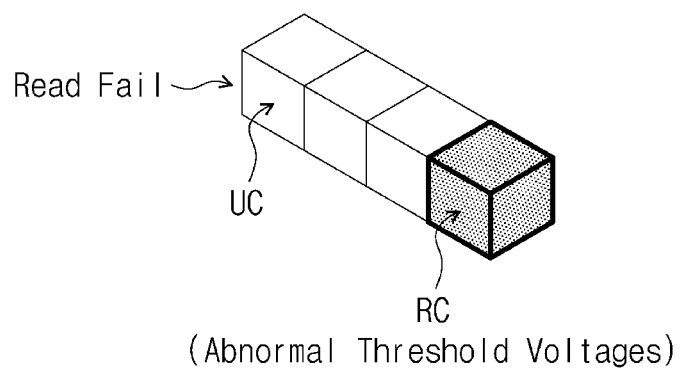
FIG. 16 illustrates an example in which a bad area determiner reads reference memory cells to determine a left-alone fail.
Figure 17:
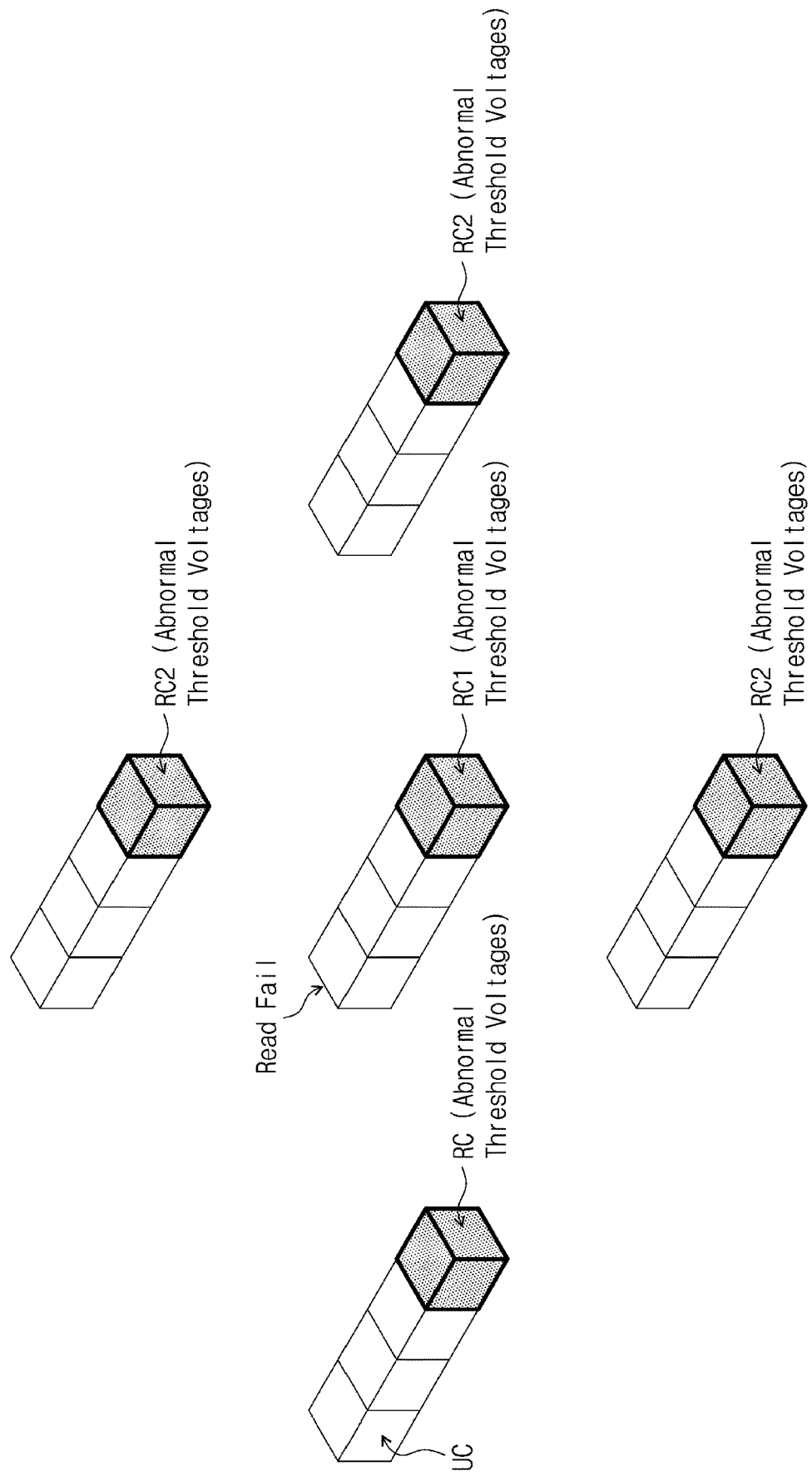
FIG. 17 illustrates an example in which a bad area determiner reads reference memory cells and peripheral reference memory cells to determine a left-alone fail.

FIGS. 16 and 17 illustrate examples in which the bad area determiner 123 determines a left-alone fail. In detail, FIG. 16 shows an example in which the bad area determiner 123 reads the reference memory cells RC to determine a left-alone fail. Referring to FIGS. 1, 4, and 16, when a read fail occurs, the bad area determiner 123 may read the reference memory cells RC connected with the same sub-word line as the user memory cells UC where the read fail occurs.

The bad area determiner 123 may determine threshold voltages of the reference memory cells RC are affected by disturbance or over time as illustrated FIG. 16. The case where the threshold voltages of the reference memory cells RC are abnormal threshold voltages causing the read fail may mean that a read reclaim operation is not appropriately performed. Accordingly, the bad area determiner 123 may determine that a bad area does not exist.

FIG. 17 shows an example in which the bad area determiner 123 reads reference memory cells RC1 and peripheral reference memory cells RC2 to determine a left-alone fail. Referring to FIGS. 1, 4, and 17, when a read fail occurs, the bad area determiner 123 may read the first reference memory cells RC1 connected with the same sub-word line as the user memory cells UC where the read fail occurs.

The bad area determiner 123 may further read the second reference memory cells RC2 adjacent to the first reference memory cells RC1. For example, the bad area determiner 123 may further read the second reference memory cells RC2 of a sub-word line above or below a sub-word line where the read fail occurs. The bad area determiner 123 may further read the second reference memory cells RC2 of adjacent sub-word lines sharing the word line with the sub-word line where the read fail occurs.

The bad area determiner 123 may determine whether threshold voltages of the first and second reference memory cells RC1 and RC2 are normal threshold voltages or abnormal threshold voltages. The case where the threshold voltages of the first and second reference memory cells RC1 and RC2 are abnormal threshold voltages causing the read fail may mean that a read reclaim operation is not appropriately performed. Accordingly, the bad area determiner 123 may determine that a bad area does not exist.

In an embodiment, the bad area determiner 123 may transmit, to the nonvolatile memory device 110, a read command for the first reference memory cells RC1 or the second reference memory cells RC2. The bad area determiner 123 may receive a read result from the nonvolatile memory device 110 and may determine whether the write fail is the left-alone fail.

For another example, the bad area determiner 123 may transmit, to the nonvolatile memory device 110, a special command for requesting the nonvolatile memory device 110 to determine whether the read fail is the left-alone fail. The nonvolatile memory device 110 may read the first reference memory cells RC1 or the second reference memory cells RC2 to determine whether the read fail is the left-alone fail. The nonvolatile memory device 110 may transmit a result of the determination to the controller 120.

Figure 18:
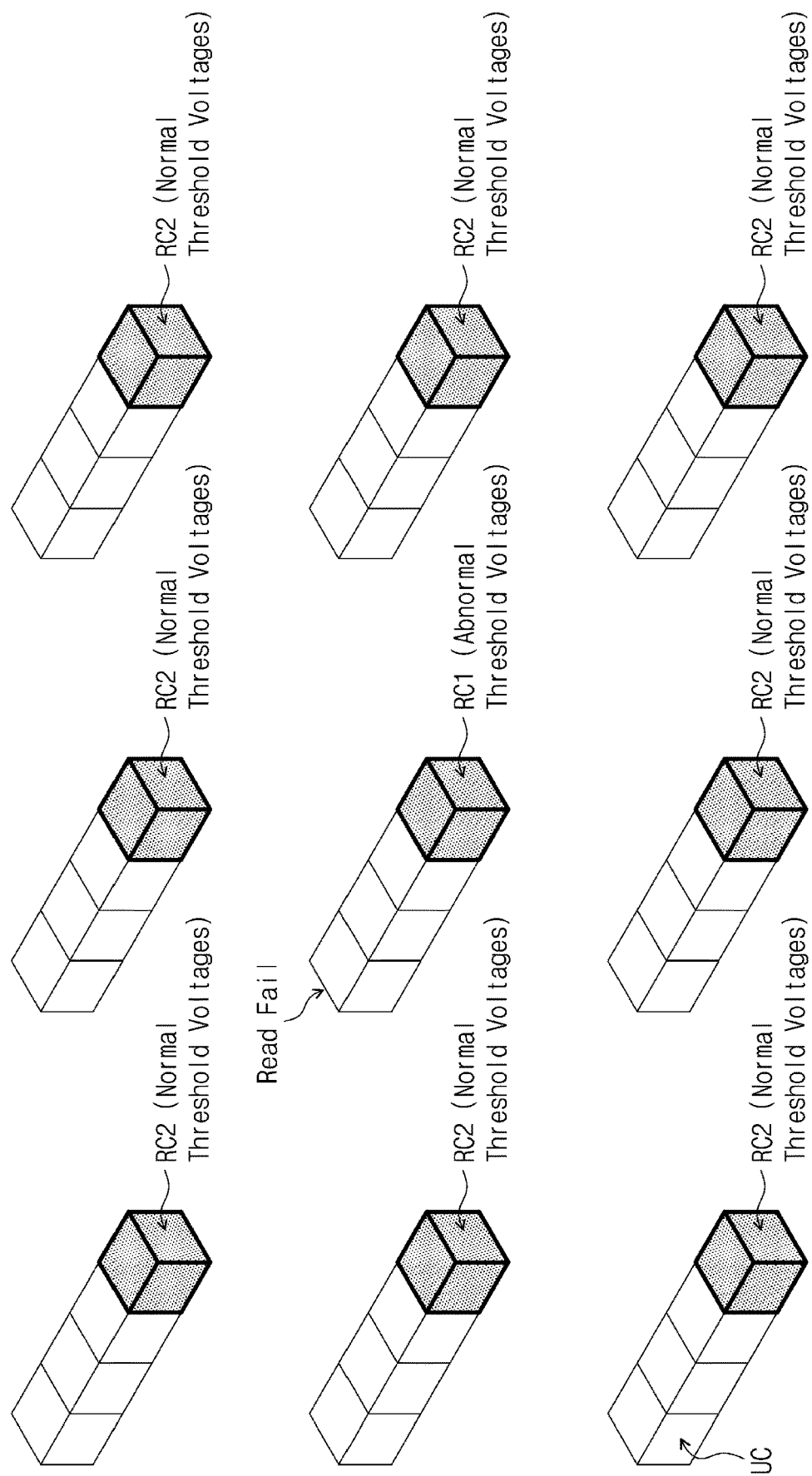
FIG. 18 illustrates an example in which a bad area determiner determines a minority sub-word line fail when a read fail occurs.

FIG. 18 illustrates an example in which the bad area determiner 123 determines a minority sub-word line fail when a read fail occurs. Referring to FIGS. 1, 4, and 18, when a read fail occurs, the bad area determiner 123 may read first reference memory cells RC1 connected with the same sub-word line as user memory cells UC where the read fail occurs.

The bad area determiner 123 may further read second reference memory cells RC2 adjacent to the first reference memory cells RC1. For example, the bad area determiner 123 may further read second reference memory cells RC2 of a sub-word line above or below a sub-word line where the read fail occurs.

The bad area determiner 123 may further read second reference memory cells RC2 of adjacent sub-word lines sharing the word line with the sub-word line where the read fail occurs. The bad area determiner 123 may further read the second reference memory cells RC2 of adjacent sub-word lines placed in diagonal directions with respect to the sub-word line where the read fail occurs.

The bad area determiner 123 may determine whether threshold voltages of the first and second reference memory cells RC1 and RC2 are normal threshold voltages or abnormal threshold voltages. If threshold voltages of reference memory cells RC2 of one sub-word line of sub-word lines belonging to one word line or threshold voltages of reference memory cells RC2 of sub-word lines, the number of which is less than a given ratio (e.g., half), from among the sub-word lines connected to the one word line change to abnormal threshold voltages causing the read fail, the bad area determiner 123 may determine memory cells of the relevant sub-word lines as a bad area.

For example, if memory cells of a specific sub-word line are more strongly affected by disturbance or the lapse of time than memory cells of a sub-word line, a defect may be present in the specific sub-word line or memory cells of the specific sub-word line. Accordingly, the bad area determiner 123 may determine the read fail as a minority sub-word line fail.

In an embodiment, the bad area determiner 123 may transmit, to the nonvolatile memory device 110, a read command for the first reference memory cells RC1 or the second reference memory cells RC2. The bad area determiner 123 may receive a read result from the nonvolatile memory device 110 and may determine whether the read fail is the minority sub-word line fail.

For another example, the bad area determiner 123 may transmit, to the nonvolatile memory device 110, a special command for requesting the nonvolatile memory device 110 to determine whether the read fail is the minority sub-word line fail. The nonvolatile memory device 110 may read the first reference memory cells RC1 or the second reference memory cells RC2 to determine whether the read fail is the minority sub-word line fail. The nonvolatile memory device 110 may transmit a result of the determination to the controller 120.

Figure 19:
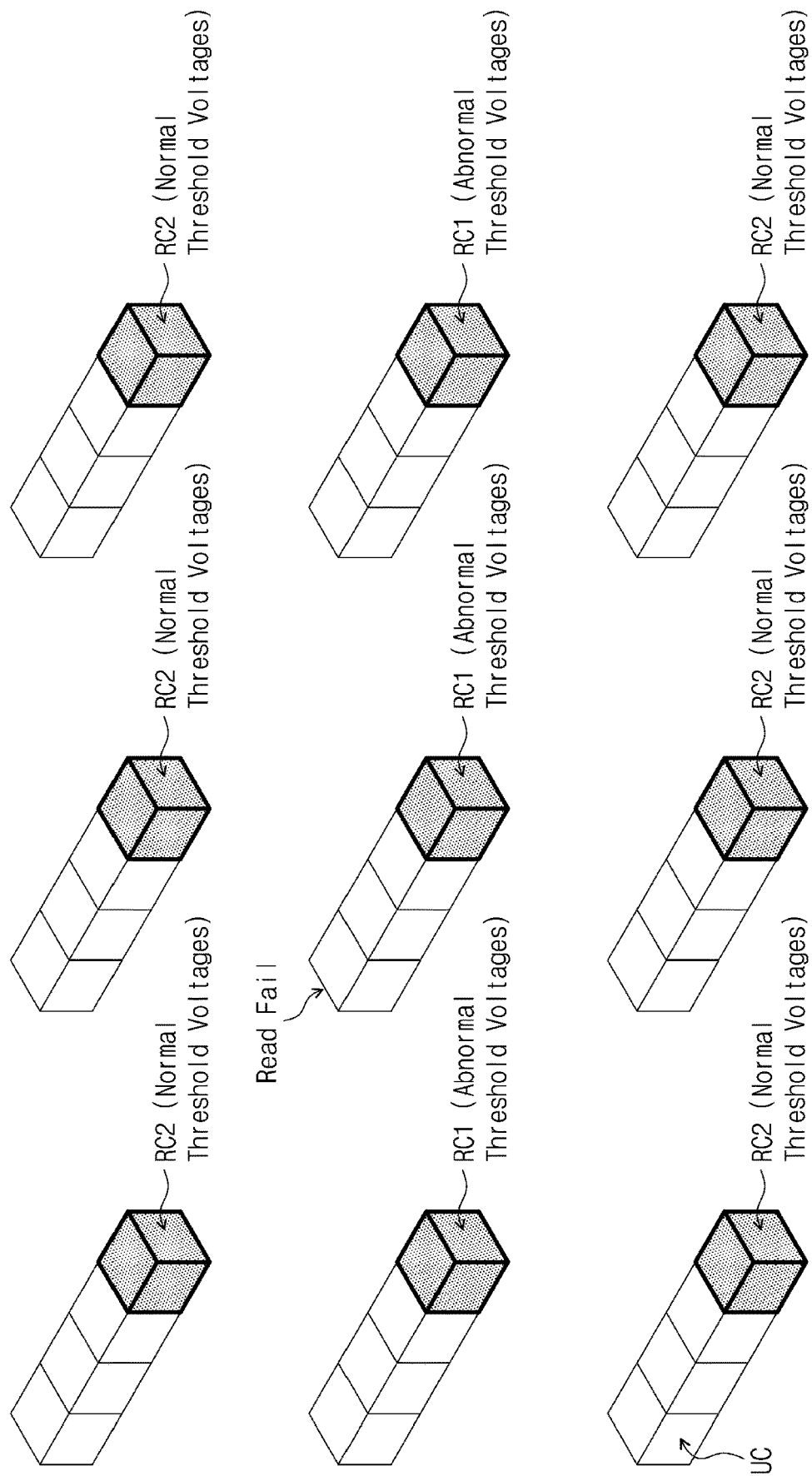
FIG. 19 illustrates an example in which a bad area determiner determines a majority sub-word line fail when a read fail occurs.

FIG. 19 illustrates an example in which the bad area determiner 123 determines a majority sub-word line fail when a read fail occurs. Referring to FIGS. 1, 4, and 19, when a read fail occurs, the bad area determiner 123 may read first reference memory cells RC1 connected with the same sub-word line as user memory cells UC where the read fail occurs.

The bad area determiner 123 may further read second reference memory cells RC2 adjacent to the first reference memory cells RC1. For example, the bad area determiner 123 may further read second reference memory cells RC2 of a sub-word line above or below a sub-word line where the read fail occurs.

The bad area determiner 123 may further read the second reference memory cells RC2 of adjacent sub-word lines sharing the word line with the sub-word line where the read fail occurs. The bad area determiner 123 may further read the second reference memory cells RC2 of adjacent sub-word lines placed in diagonal directions with respect to the sub-word line where the read fail occurs.

The bad area determiner 123 may determine whether threshold voltages of the first and second reference memory cells RC1 and RC2 are normal threshold voltages or abnormal threshold voltages. If threshold voltages of reference memory cells of all sub-word lines connected to one word line or threshold voltages of reference memory cells of sub-word lines, the number of which is not less than a given ratio (e.g., half), from among the sub-word lines connected to the one word line change to abnormal threshold voltages causing the read fail, the bad area determiner 123 may determine memory cells of the relevant word line as a bad area. That is, the bad area determiner 123 may determine the read fail as a majority sub-word line fail.

In an embodiment, the bad area determiner 123 may transmit, to the nonvolatile memory device 110, a read command for the first reference memory cells RC1 or the second reference memory cells RC2. The bad area determiner 123 may receive a read result from the nonvolatile memory device 110 and may determine whether the read fail is the majority sub-word line fail.

For another example, the bad area determiner 123 may transmit, to the nonvolatile memory device 110, a special command for requesting the nonvolatile memory device 110 to determine whether the read fail is the majority sub-word line fail. The nonvolatile memory device 110 may read the first reference memory cells RC1 or the second reference memory cells RC2 to determine whether the read fail is the majority sub-word line fail. The nonvolatile memory device 110 may transmit a result of the determination to the controller 120.

Figure 20:
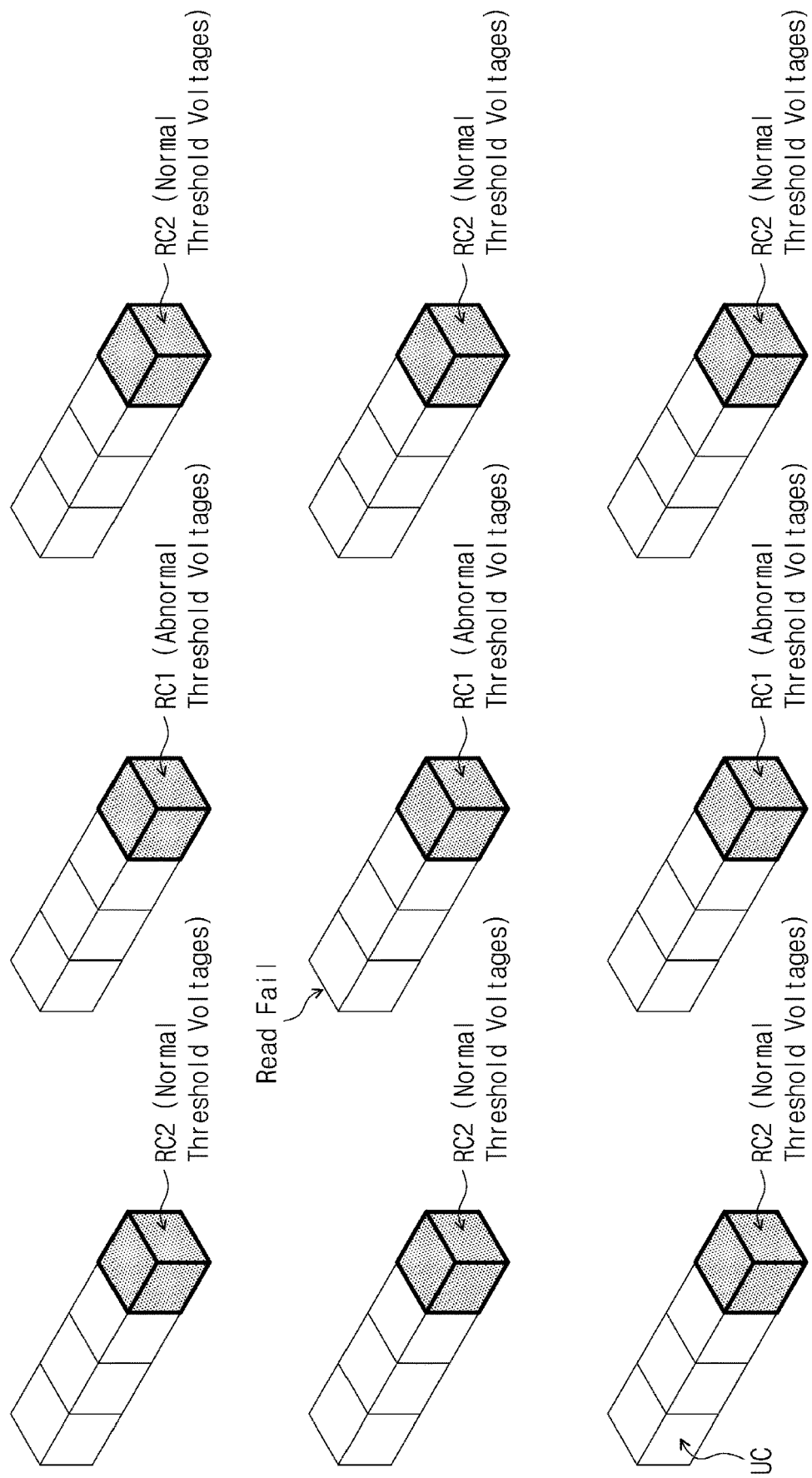
FIG. 20 illustrates an example in which a bad area determiner determines a row fail when a read fail occurs.

FIG. 20 illustrates an example in which the bad area determiner 123 determines a row fail when a read fail occurs. Referring to FIGS. 1, 4, and 20, when a read fail occurs, the bad area determiner 123 may read first reference memory cells RC1 connected with the same sub-word line as user memory cells UC where the read fail occurs.

The bad area determiner 123 may further read second reference memory cells RC2 adjacent to the first reference memory cells RC1. For example, the bad area determiner 123 may further read second reference memory cells RC2 of a sub-word line above or below a sub-word line where the read fail occurs.

The bad area determiner 123 may further read second reference memory cells RC2 of adjacent sub-word lines sharing the word line with the sub-word line where the read fail occurs. The bad area determiner 123 may further read the second reference memory cells RC2 of adjacent sub-word lines placed in diagonal directions with respect to the sub-word line where the read fail occurs.

The bad area determiner 123 may determine whether threshold voltages of the first and second reference memory cells RC1 and RC2 are normal threshold voltages or abnormal threshold voltages. If threshold voltages of reference memory cells of all sub-word lines belonging to the same row or threshold voltages of reference memory cells of sub-word lines, the number of which is not less than a given ratio (e.g., half), from among the sub-word lines belonging to the same row are abnormal threshold voltages, the bad area determiner 123 may determine the read fail as a row fail.

In an embodiment, the bad area determiner 123 may transmit, to the nonvolatile memory device 110, a read command for the first reference memory cells RC1 or the second reference memory cells RC2. The bad area determiner 123 may receive a read result from the nonvolatile memory device 110 and may determine whether the read fail is the row fail.

For another example, the bad area determiner 123 may transmit, to the nonvolatile memory device 110, a special command for requesting the nonvolatile memory device 110 to determine whether the read fail is the row fail. The nonvolatile memory device 110 may read the first reference memory cells RC1 or the second reference memory cells RC2 to determine whether the read fail is the row fail. The nonvolatile memory device 110 may transmit a result of the determination to the controller 120.

Figure 21:
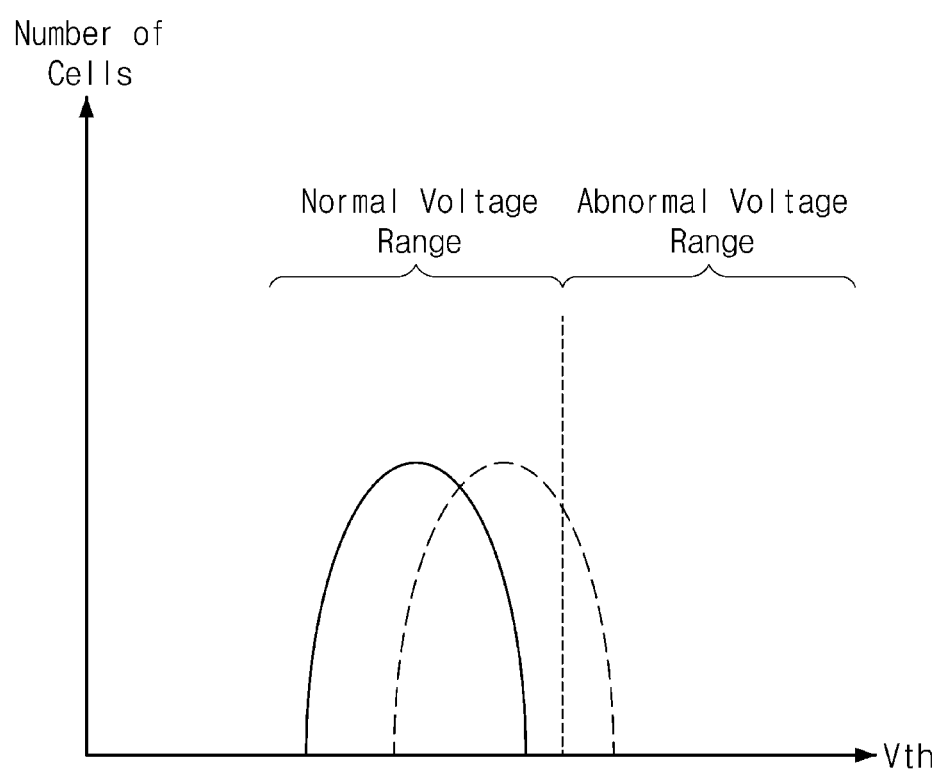
FIG. 21 illustrates an example of threshold voltages of memory cells formed by an erase operation.

FIG. 21 illustrates an example of threshold voltages of memory cells formed by an erase operation. In FIG. 21, a horizontal axis represents a threshold voltage, and a vertical axis represents the number of memory cells. Referring to FIGS. 1, 4, and 21, memory cells are controlled to have threshold voltages belonging to a normal voltage range in an erase operation. A solid line indicates an example of threshold voltages of memory cells belonging to a normal voltage range.

When at least a part of threshold voltages of memory cells does not belong to the normal voltage range in the erase operation, an erase fail occurs. A dotted line indicates an example of threshold voltages of memory cells when the erase fail occurs. When the erase fail occurs, the bad area determiner 123 may read the first and second reference memory cells RC1 and RC2 as described with reference to FIG. 18.

The bad area determiner 123 may determine whether threshold voltages of the first and second reference memory cells RC1 and RC2 belong to an abnormal threshold range. For example, reference data may have a pattern that is determined in such a way that a threshold voltage distribution determined as the erase fail, that is, a threshold voltage distribution belonging to the abnormal voltage range is easily determined (or verified). The bad area determiner 123 may determine whether the erase fail is a minority sub-word line fail, by reading the reference data.

Likewise, when the erase fail occurs, the bad area determiner 123 may read the first and second reference memory cells RC1 and RC2 as described with reference to FIG. 19. The bad area determiner 123 may determine whether the erase fail is a majority sub-word line fail, depending on threshold voltages of the first and second reference memory cells RC1 and RC2.

Likewise, when the erase fail occurs, the bad area determiner 123 may read the first and second reference memory cells RC1 and RC2 as described with reference to FIG. 20. The bad area determiner 123 may determine whether the erase fail is a row fail, depending on threshold voltages of the first and second reference memory cells RC1 and RC2.

Figure 22:
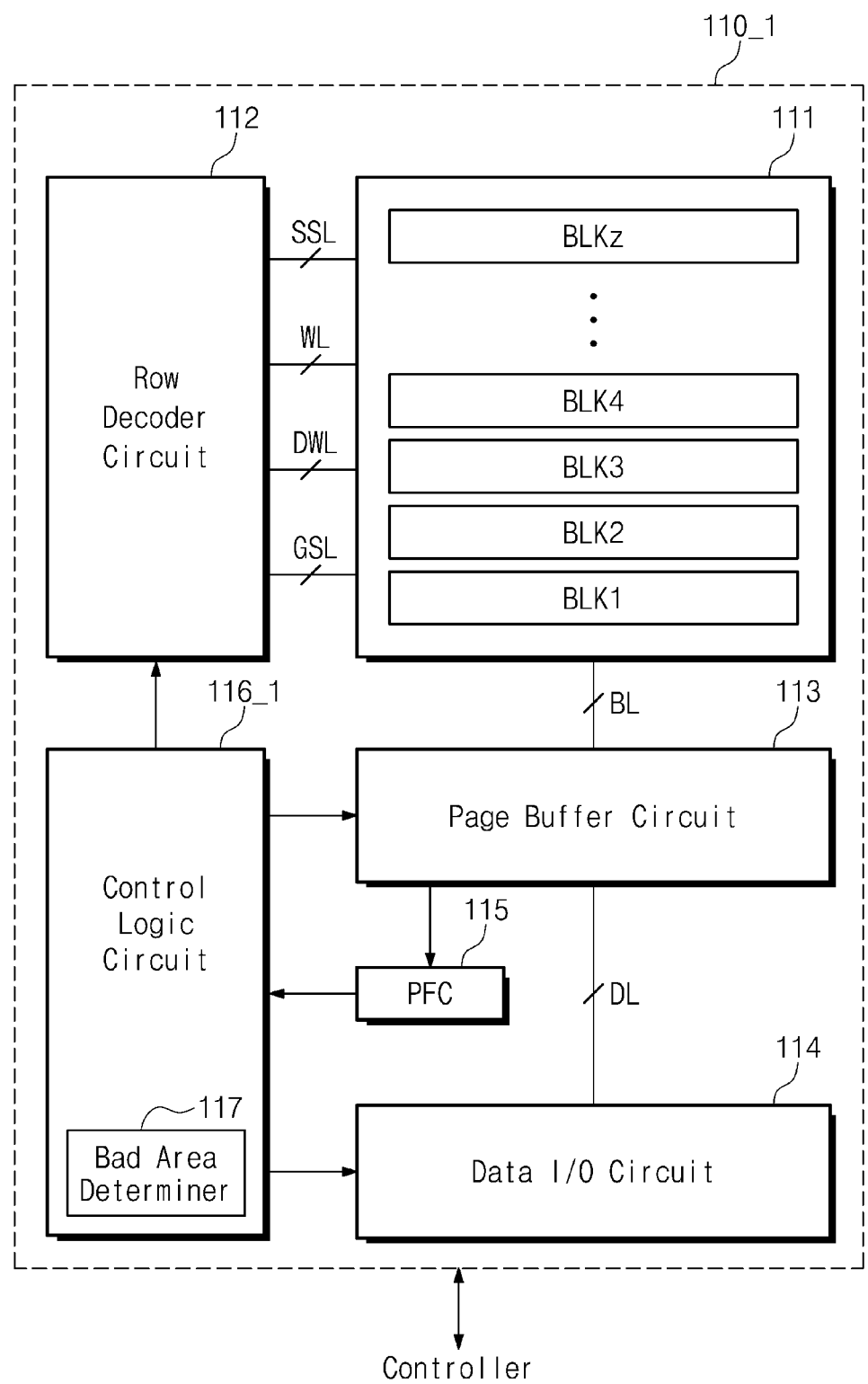
FIG. 22 is a block diagram illustrating a nonvolatile memory device according to another embodiment of the disclosure.
Figure 23:
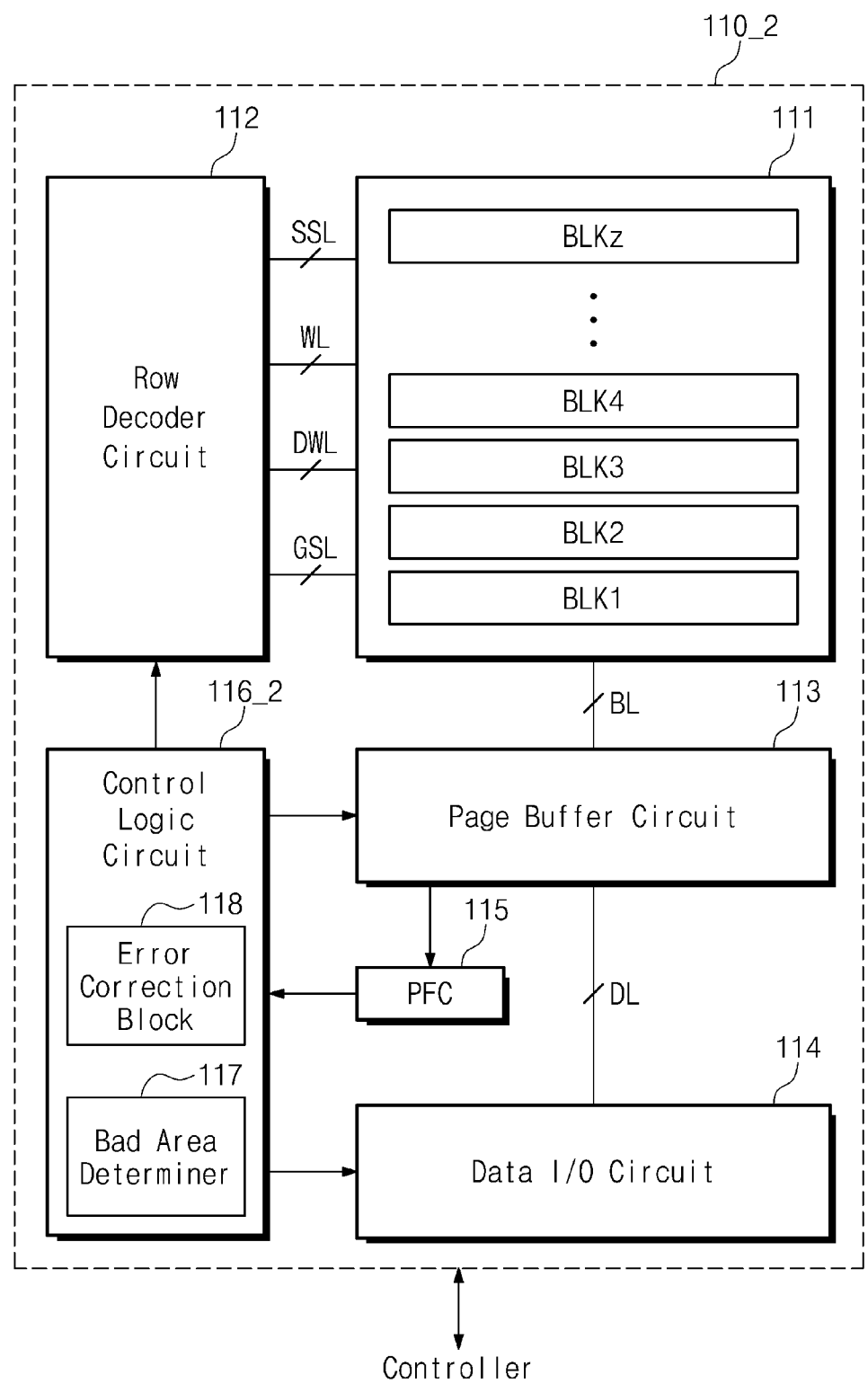
FIG. 23 is a block diagram of a nonvolatile memory device according to another embodiment of the disclosure.

FIG. 22 is a block diagram illustrating a nonvolatile memory device 110_1 according to another embodiment of the disclosure. Referring to FIGS. 1 and 23, the nonvolatile memory device 110_1 includes the memory cell array 111, the row decoder circuit 112, the page buffer circuit 113, the data input/output circuit 114, the pass-fail check circuit 115, and a control logic circuit 116_1.

Compared with the control logic circuit 116 of the nonvolatile memory device 110 of FIG. 3, the control logic circuit 116_1 of the nonvolatile memory device 110_1 of FIG. 22 includes a bad area determiner 117. The bad area determiner 117 may determine a fail type and a bad area when a write fail or an erase fail occurs.

The bad area determiner 117 may transmit information of the bad area to the external controller 120. The controller 120 may receive the information of the bad area from the nonvolatile memory device 110_1. The flash translation layer 122 may inhibit an access to the bad area.

FIG. 23 is a block diagram illustrating a nonvolatile memory device 110_2 according to another embodiment of the disclosure. Referring to FIGS. 1 and 23, the nonvolatile memory device 110_2 includes the memory cell array 111, the row decoder circuit 112, the page buffer circuit 113, the data input/output circuit 114, the pass-fail check circuit 115, and a control logic circuit 116_2.

Compared with the control logic circuit 116_1 of the nonvolatile memory device 110_1 of FIG. 22, the control logic circuit 116_2 of the nonvolatile memory device 110_2 of FIG. 23 includes an error correction block 118. Like the error correction block 121 described with reference to FIG. 1, the error correction block 118 may perform error correction encoding on data to be written in the memory cell array 111 and may perform error correction decoding on data read from the memory cell array 111.

The bad area determiner 117 may determine a fail type and a bad area when a write fail, a read fail, or an erase fail occurs. The bad area determiner 117 may transmit information of the bad area to the external controller 120. The controller 120 may receive the information of the bad area from the nonvolatile memory device 110_2. The flash translation layer 122 may inhibit an access to the bad area.

Figure 24:
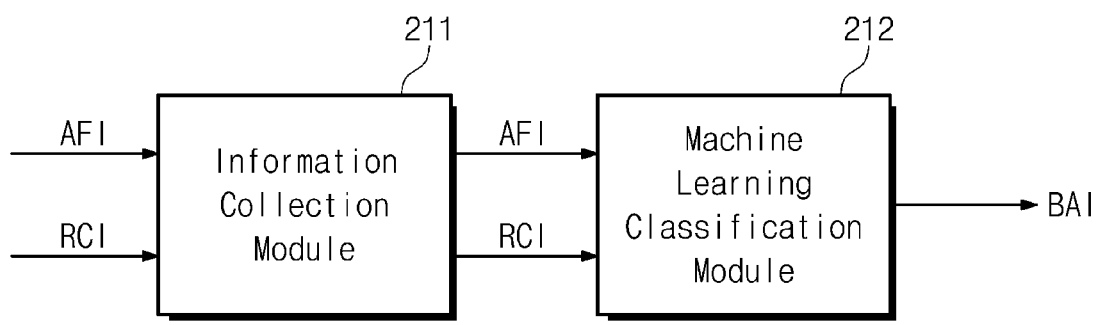
FIG. 24 is a block diagram illustrating an example of a bad area determiner.

FIG. 24 is a block diagram illustrating an example of the bad area determiner 123 or 117. Referring to FIGS. 1 and 24, the bad area determiner 123/117 includes an information collection module 211 and a machine learning classification module 212. The information collection module 211 may collect information for performing machine learning classification.

For example, the information collection module 211 may collect access fail information AFI and reference memory cell information RCI. The access fail information AFI may include an access kind, an address, a temperature, a data kind, a history, etc. The reference memory cell information RCI may include a result of performing read operations on reference memory cells.

The information collection module 211 may transmit the access fail information AFI and the reference memory cell information RCI to the machine learning classification module 212. The machine learning classification module 212 may perform machine learning-based classification on the access fail information AFI and the reference memory cell information RCI. The machine learning-based classification may include a decision tree, a neural network, a support vector machine, etc.

The machine learning classification module 212 may output bad area information BAI as a result of the machine learning-based classification. The flash translation layer 122 may set a bad area depending on the bad area information BAI.

Figure 25:
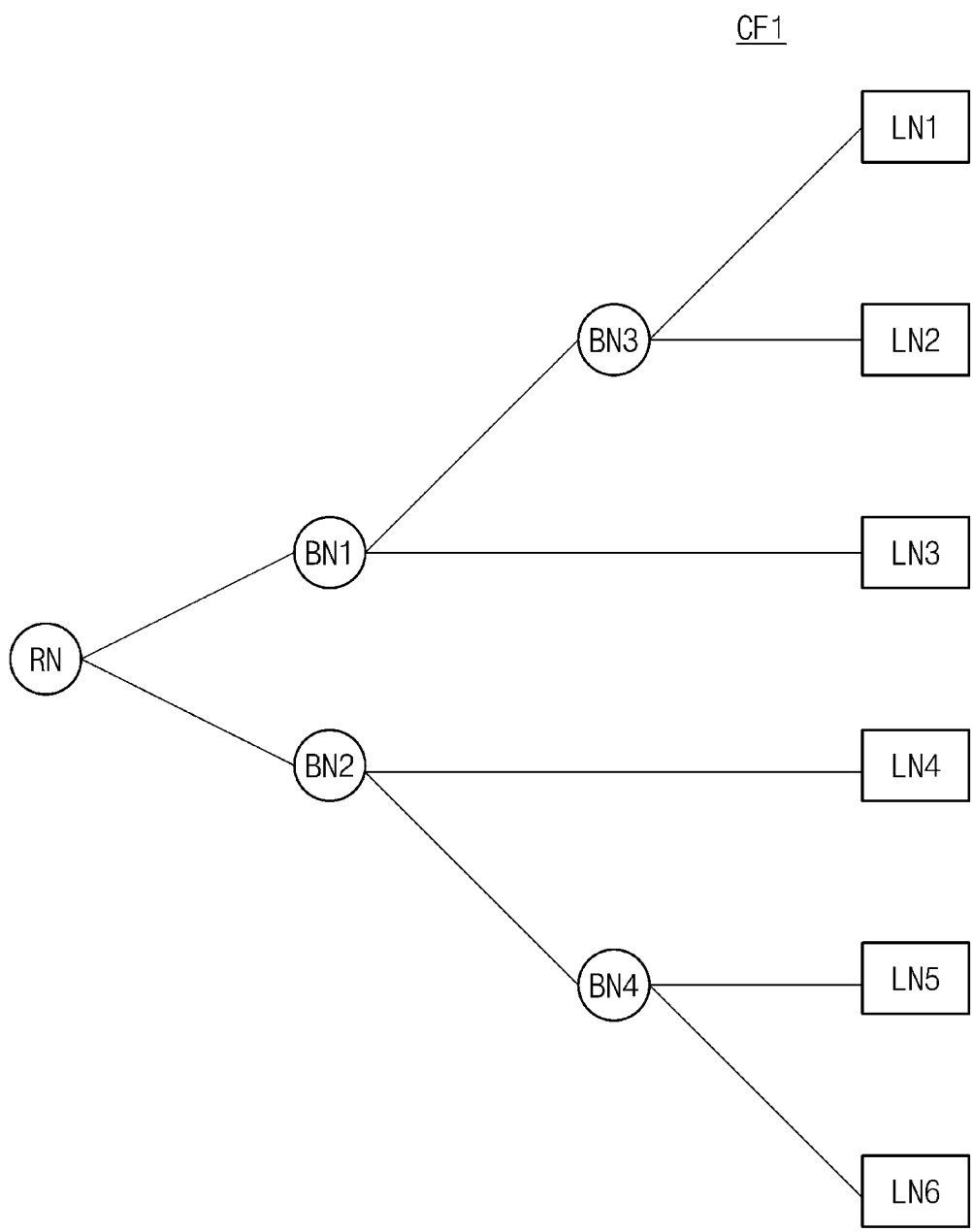
FIG. 25 illustrates an example of a classifier of a machine learning classification module.

FIG. 25 illustrates an example of a classifier of the machine learning classification module 212. In an embodiment, a classifier CF1 may be a decision tree. Referring to FIGS. 24 and 25, the classifier CF1 includes a root node RN, first to fourth branch nodes BN1 to BN4, and first to sixth leaf nodes LN1 to LN6. The root node RN, the first to fourth branch nodes BN1 to BN4, and the first to sixth leaf nodes LN1 to LN6 may be connected through branches.

In each of the root node RN and the first to fourth branch nodes BN1 to BN4, comparison may be performed with respect to at least one of the access fail information AFI and the reference memory cell information RCI. One of a plurality of branches connected to each node is selected depending on a result of the comparison. If a next branch node is connected to the selected branch, comparison may be further performed at the next branch node.

In the case where a leaf node is connected to the selected branch, a value of the leaf node may be obtained as the bad area information BAI. In an embodiment, information, which has the highest selectivity, from among the access fail information AFI and the reference memory cell information RCI may be compared at the root node RN.

Figure 26:
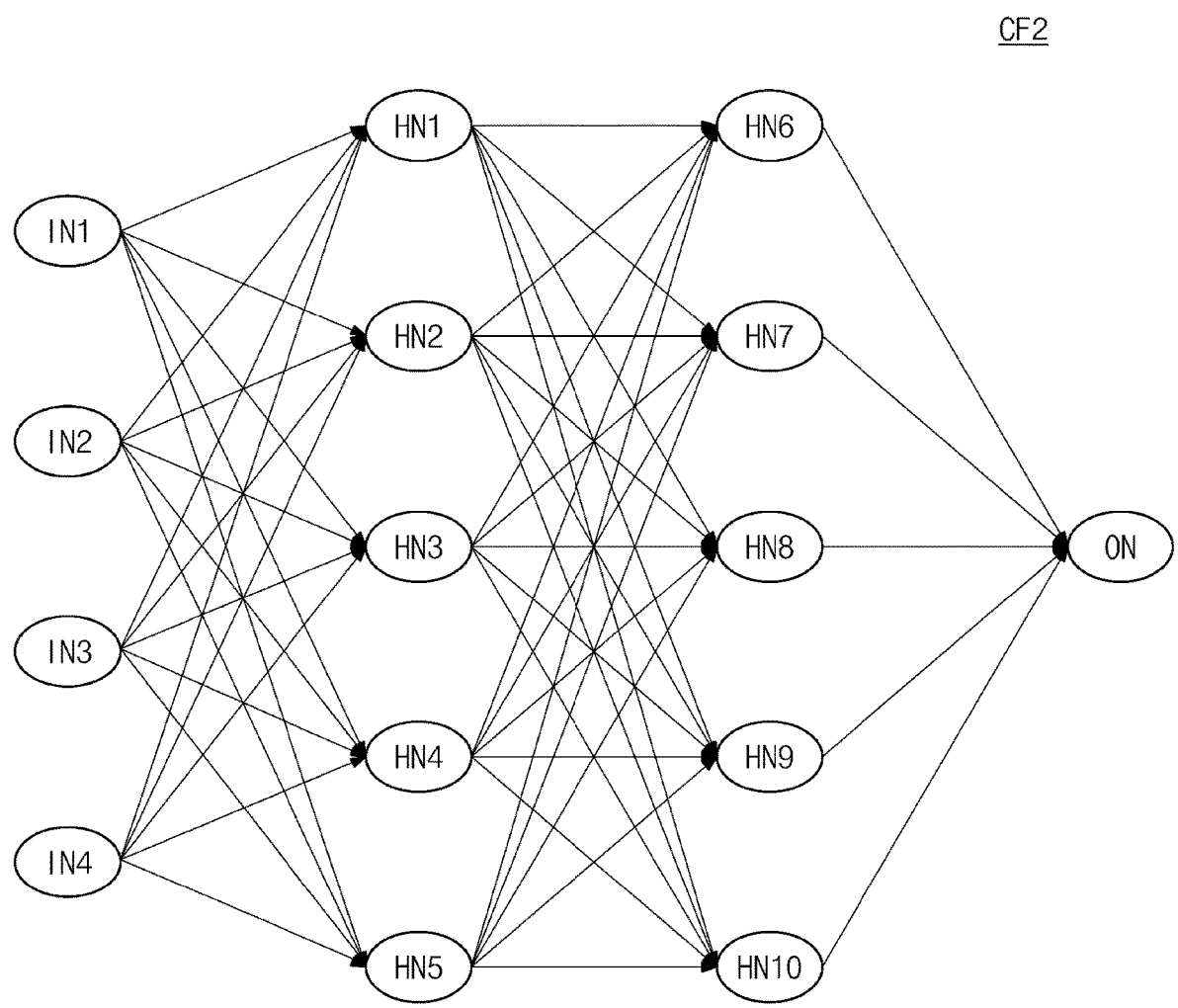
FIG. 26 illustrates another example of a classifier of a machine learning classification module.

FIG. 26 illustrates another example of a classifier of the machine learning classification module 212. In an embodiment, a classifier CF2 may be a neural network. Referring to FIGS. 24 and 26, the classifier CF1 includes first to fourth input nodes IN1 to IN4, first to tenth hidden nodes HN1 to HN10, and an output node ON. The number of input nodes, the number of hidden nodes, and the number of output nodes may be determined in advance upon constructing the neural network.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance upon constructing the neural network.

The access fail information AFI and the reference memory cell information RCI may be input to the first to fourth input nodes IN1 to IN4. Different kinds of access fail information AFI and reference memory cell information RCI may be input to different input nodes. The information of each input node is transmitted to the first to fifth hidden nodes HN1 to HN5 of the first hidden layer, with weights applied to the information thereof.

An input of each of the first to fifth hidden nodes HN1 to HN5 is transmitted to the sixth to tenth hidden nodes HN6 to HN10 of the second hidden node, with weights applied to the input thereof. Inputs of the sixth to tenth hidden nodes HN6 to HN10 are transmitted to the output node ON, with weights applied to the inputs thereof. Information of the output node ON may be output as the bad area information BAI.

Figure 27:
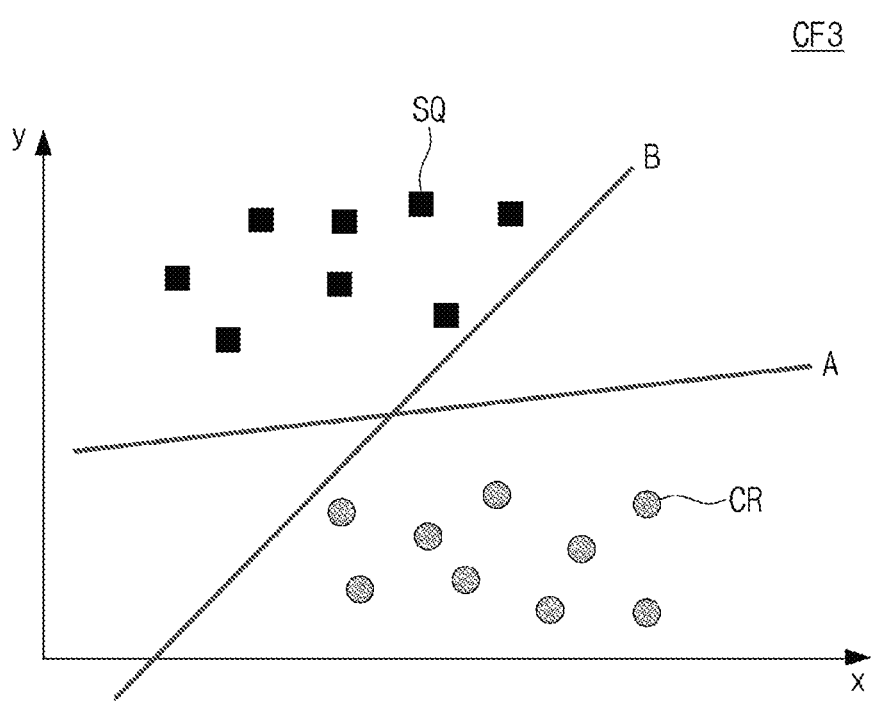
FIG. 27 illustrates another example of a classifier of a machine learning classification module.

FIG. 27 illustrates another example of a classifier of the machine learning classification module 212. In an embodiment, an access classifier CF3 may be a support vector machine. In FIG. 27, a horizontal axis "x" represents the access fail information AFI, and a vertical axis "y" represents the reference memory cell information RCI. Shapes (a square SR and a circle CR) of samples distributed in FIG. 27 indicate different bad area information BAI. The machine learning classification module 212 may determine the bad area information BAI depending on whether the access fail information AFI and the reference memory cell information RCI are included in any area with respect to line A or B.

In the above-described embodiments, components according to embodiments of the disclosure are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

According to embodiments of the disclosure, a type of an access fail is determined, and a bad area is differently set depending on the type of the access fail. Accordingly, a storage device including a nonvolatile memory device that reduces a decrease in a storage capacity due to setting a bad area, the nonvolatile memory device, and an operating method of the storage device are provided.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A storage device comprising:
a nonvolatile memory device including memory cells and reference memory cells; and
a controller that:
accesses first memory cells of the memory cells,
reads, when the access to the first memory cells fails, first reference memory cells, among the reference memory cells, that are associated with the first memory cells but do not include the first memory cells,
determines, based on a read result of the first reference memory cells, a bad area within the memory cells that includes the first memory cells, and
identifies second memory cells, from among the memory cells, that belong to the bad area as bad memory cells.

2. The storage device of claim 1, wherein the controller transmits to the nonvolatile memory device:
a first command for accessing the first memory cells, and
a second command for reading the first reference memory cells when the nonvolatile memory device communicates an access fail to the controller.

3. The storage device of claim 2, wherein the controller:
transmits to the nonvolatile memory device a third command for reading second reference memory cells, of the reference memory cells, and
determines the bad area depending on results obtained by executing the second command and the third command.

4. The storage device of claim 1, wherein the first memory cells and the first reference memory cells are associated with a same string selection line and a same word line.

5. The storage device of claim 1, wherein the first memory cells and the first reference memory cells are associated with a same string selection line and a same bit line.

6. The storage device of claim 1, wherein when the access to the first memory cells fails due to a left-alone fail, the controller determines that the bad area does not exist.

7. The storage device of claim 1, wherein:
the memory cells are connected to sub-word lines and two or more sub-word lines of the sub-word lines are grouped and connected to each of word lines, and
when the access to the first memory cells fails due to a failure of a minority of the sub-word lines connected to a specific word line, the controller identifies the minority of the sub-word lines as the bad area.

8. The storage device of claim 1, wherein:
the memory cells are connected to sub-word lines and two or more sub-word lines of the sub-word lines are grouped and connected to each of word lines, and
when the access to the first memory cells fails due to a failure of a majority of the sub-word lines of connected to a specific word line, the controller identifies the specific word line as the bad area.

9. The storage device of claim 1, wherein:
the nonvolatile memory device includes cell strings, disposed on a substrate in rows and columns, that include the memory cells,
the memory cells of the cell strings are stacked in a direction perpendicular to the substrate, and
when the access to the first memory cells fails due to a failure of a specific row, the controller identifies cell strings of the specific row, among the cell strings, as the bad area.

10. The storage device of claim 1, wherein:
the nonvolatile memory device includes memory blocks, each of the memory blocks including the memory cells, and
when the access to the first memory cells fails due to a failure of a specific memory block of the memory blocks and a specific cause of the failure is not determined, the controller identifies the specific memory block, to which the first memory cells belong, as the bad area.

11. The storage device of claim 1, wherein the access to the first memory cells is a write operation, a read operation, or an erase operation.

12. The storage device of claim 1, wherein the reference memory cells include dummy memory cells, selection transistors, reference memory cells storing reference data corresponding to a specific threshold voltage range, or memory cells used to store user data.

13. The storage device of claim 1, wherein the controller identifies the bad area depending on a threshold voltage distribution of the first reference memory cells.

14. The storage device of claim 1, wherein the controller compares a threshold voltage distribution of the first reference memory cells and a threshold voltage distribution of second reference memory cells of the reference memory cells to identify the bad area.

15. The storage device of claim 1, wherein: the controller identifies the bad area depending on fail information of the first memory cells and the read result of the first reference memory cells.

16. A nonvolatile memory device comprising:
a memory cell array including memory cells and reference memory cells;
a row decoder circuit connected to the memory cell array through word lines;
a page buffer circuit connected to the memory cell array through bit lines; and
a control logic circuit that controls:
the row decoder circuit and the page buffer circuit to access first memory cells of the memory cells, and
the row decoder circuit and the page buffer circuit to read first reference memory cells, which are associated with the first memory cells but do not include the first memory cells, when the access to the first memory cells fails, wherein
the control logic circuit identifies, based on a read result of the first reference memory cells, a bad area within the memory cells that includes the first memory cells.

17. The nonvolatile memory device of claim 16, wherein the control logic circuit controls the page buffer circuit to output the read result of the first reference memory cells to an external device.

18. The nonvolatile memory device of claim 16, wherein the control logic circuit identifies the bad area depending on the read result of the first reference memory cells and outputs information of the bad area to an external device.

19. An operating method executed by a storage device that includes a controller and a nonvolatile memory device having memory cells and reference memory cells, the method comprising:

accessing first memory cells of the memory cells;
reading first reference memory cells, which are associated with the first memory cells but do not include the first memory cells, from among the reference memory cells when the access to the first memory cells fails; and
identifying, based on a read result of the first reference memory cells, a bad area within the memory cells that includes the first memory cells.

20. The method of claim 19, wherein when the access to the first memory cells fails due to a left-alone fail, the bad area is determined to not exist.

* * * * *